US012558909B2

(12) United States Patent
Yanagihara

(10) Patent No.: US 12,558,909 B2
(45) Date of Patent: Feb. 24, 2026

(54) LIQUID DISCHARGE APPARATUS AND COOLING UNIT

(71) Applicant: SEIKO EPSON CORPORATION, Tokyo (JP)

(72) Inventor: Hirokazu Yanagihara, Chino (JP)

(73) Assignee: SEIKO EPSON CORPORATION (JP)

( * ) Notice: Subject to any disclaimer, the term of this patent is extended or adjusted under 35 U.S.C. 154(b) by 104 days.

(21) Appl. No.: 18/613,382

(22) Filed: Mar. 22, 2024

(65) Prior Publication Data

US 2024/0316971 A1 Sep. 26, 2024

(30) Foreign Application Priority Data

Mar. 24, 2023 (JP) ................................. 2023-047852

(51) Int. Cl.
*B41J 29/377* (2006.01)
*H05K 7/20* (2006.01)

(52) U.S. Cl.
CPC ........ *B41J 29/377* (2013.01); *H05K 7/20145* (2013.01); *H05K 7/20209* (2013.01)

(58) Field of Classification Search
CPC ... B41J 29/377; B41J 29/38; B41J 2/01; B41J 2/07; B41J 2/14201; B41J 29/393; H05K 7/20145; H05K 7/20209
See application file for complete search history.

(56) References Cited

U.S. PATENT DOCUMENTS

| | | | |
|---|---|---|---|
| 2017/0355207 A1* | 12/2017 | Ishikawa | ................ B41J 25/006 |
| 2018/0009248 A1 | 1/2018 | Kitazawa et al. | |
| 2020/0269580 A1 | 8/2020 | Kondo | |
| 2023/0042550 A1* | 2/2023 | Kondo | ............... H05K 7/20436 |

FOREIGN PATENT DOCUMENTS

JP 2020-138356 A 9/2020

* cited by examiner

*Primary Examiner* — Shelby L Fidler
*Assistant Examiner* — Tracey M Mcmillion
(74) *Attorney, Agent, or Firm* — Harness, Dickey & Pierce, P.L.C.

(57) ABSTRACT

A liquid discharge apparatus including: a first drive circuit generating a first drive signal; a second drive circuit generating a second drive signal; a first discharge section discharging a liquid onto a medium based on the first drive signal; a second discharge section discharging a liquid onto the medium based on the second drive signal; a blowing section generating an airflow; a first wind tunnel guiding the airflow to a first path; and a second wind tunnel guiding the airflow to a second path different from the first path, wherein the first drive circuit is disposed inside the first wind tunnel, the second drive circuit is disposed inside the second wind tunnel, and the first discharge section and the second discharge section are disposed outside the first wind tunnel and the second wind tunnel.

9 Claims, 16 Drawing Sheets

FIG. 5

| [SIH, SIL] | [1, 1]<br>LD | [1, 0]<br>SD | [0, 1]<br>ND | [0, 0]<br>BSD |
|:---:|:---:|:---:|:---:|:---:|
| S1 | H | L | L | L |
| S2 | L | H | L | L |
| S3 | L | L | L | H |

FIG. 6

WTo

HS

6

700

10-1  10-2  10-3

30-3

30-1      30-2

WTi 20-1  20-2      20-3

5-1   5-2  5-3

Z2

Y2 ⊗ X2

WTo

700

6

10-1

30-1

WTi 20-3

20-2

5-3

5-2

20-1

5-1

Z2

X2   Y2

LIQUID DISCHARGE APPARATUS AND COOLING UNIT

The present application is based on, and claims priority from JP Application Serial Number 2023-047852, filed Mar. 24, 2023, the disclosure of which is hereby incorporated by reference herein in its entirety.

BACKGROUND

1. Technical Field

The present disclosure relates to a liquid discharge apparatus and a cooling unit.

2. Related Art

In a liquid discharge apparatus that discharges a liquid such as an ink from a head to form an image on a medium, it is necessary to have high discharge stability in order to form a high-definition image. When a distance from a drive circuit that drives the head to the head increases, an influence of inductance due to a wiring increases, and the discharge stability may decrease. Therefore, as disclosed in JP-A-2020-138356, a configuration is known in which a drive circuit is disposed immediately above the head.

In such a liquid discharge apparatus, electronic components such as an integrated circuit, an FET, and a coil constituting the drive circuit are densely disposed within a limited range of an upper portion of the head, so that the drive circuit reaches an extremely high temperature. Therefore, as disclosed in JP-A-2020-138356, the drive circuit is generally cooled by air cooling. However, when an airflow is generated immediately above the head, ink mist floating with the discharge of the ink may be blown. When the ink mist is blown and adheres to the drive circuit, a short circuit may occur in the drive circuit.

SUMMARY

According to an aspect of the present disclosure, there is provided a liquid discharge apparatus including: a first drive circuit generating a first drive signal; a second drive circuit generating a second drive signal; a first discharge section discharging a liquid onto a medium based on the first drive signal; a second discharge section discharging a liquid onto the medium based on the second drive signal; a blowing section generating an airflow; a first wind tunnel guiding the airflow to a first path; and a second wind tunnel guiding the airflow to a second path different from the first path, in which the first drive circuit is disposed inside the first wind tunnel, the second drive circuit is disposed inside the second wind tunnel, and the first discharge section and the second discharge section are disposed outside the first wind tunnel and the second wind tunnel.

According to another aspect of the present disclosure, there is provided a cooling unit attached to a first head unit including a first drive circuit that generates a first drive signal and a first discharge section that discharges a liquid onto a medium based on the first drive signal, and a second head unit including a second drive circuit that generates a second drive signal and a second discharge section that discharges a liquid onto the medium based on the second drive signal, the cooling unit including: a blowing section generating an airflow; a first wind tunnel guiding the airflow to a first path; and a second wind tunnel guiding the airflow to a second path different from the first path, in which the first drive circuit is disposed inside the first wind tunnel, the second drive circuit is disposed inside the second wind tunnel, and the first discharge section and the second discharge section are disposed outside the first wind tunnel and the second wind tunnel.

BRIEF DESCRIPTION OF THE DRAWINGS

FIG. 5 is a table illustrating an example of a decoding content in a decoder.

FIG. 6 is a diagram illustrating an example of a configuration of a selection circuit.

DESCRIPTION OF EMBODIMENTS

Hereinafter, preferred embodiments of the present disclosure will be described with reference to the drawings. The drawings used are for convenience of description. The embodiments described below do not unreasonably limit the content of the present disclosure described in the claims. In addition, not all of the configurations described below are essential components of the present disclosure.

1. Configuration of Liquid Discharge Apparatus

Figure 1:
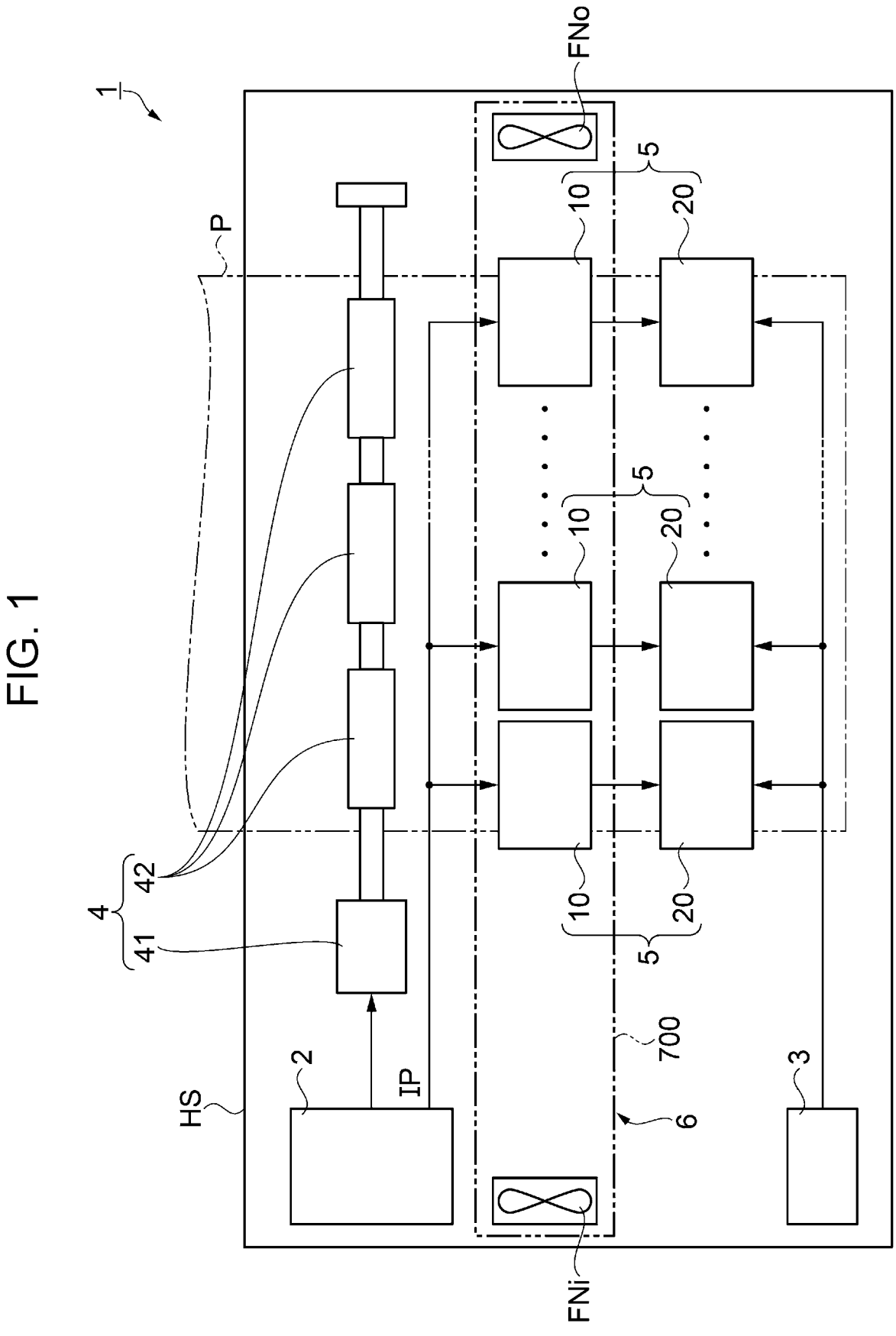
FIG. 1 is a diagram illustrating a schematic configuration of a liquid discharge apparatus.

FIG. 1 is a diagram illustrating a schematic configuration of a liquid discharge apparatus 1. As illustrated in FIG. 1, the liquid discharge apparatus 1 is a so-called line-type ink jet printer that forms a desired image on a medium P transported by a transport unit 4 by discharging an ink, which is an example of a liquid, onto the medium P at a desired timing. Here, in the following description, a direction where the medium P is transported may be referred to as a transport direction, and a width direction of the transported medium P may be referred to as a main scanning direction.

As illustrated in FIG. 1, the liquid discharge apparatus 1 includes a control unit 2, a liquid container 3, a transport unit 4, a plurality of head units 5, a cooling unit 6, and a housing HS. The housing HS constitutes an exterior of the liquid discharge apparatus 1, and encompasses the control unit 2, the liquid container 3, the transport unit 4, the plurality of head units 5, and the cooling unit 6. Note that a configuration may be adopted in which a part of the control unit 2, the liquid container 3, the transport unit 4, the plurality of head units 5, and the cooling unit 6 is disposed outside the housing HS or protrudes from an inside of the housing HS to the outside.

The control unit 2 includes a processing circuit such as a central processing unit (CPU) and a field programmable gate array (FPGA), and a storage circuit such as a semiconductor memory. The control unit 2 outputs a signal for controlling each element of the liquid discharge apparatus 1 based on image data supplied from an external device such as a host computer (not illustrated) provided outside the liquid discharge apparatus 1.

The liquid container 3 stores one or a plurality of types of liquids to be supplied to the head unit 5. For example, the liquid container 3 stores an ink to be supplied to the head unit 5. Specifically, the liquid container 3 stores inks of a plurality of colors to be discharged to the medium P, such as black, cyan, magenta, yellow, red, and gray. Of course, the liquid container 3 may store only the black ink or may store a liquid other than the ink.

The transport unit 4 includes a transport motor 41 and a transport roller 42. A transport control signal output by the control unit 2 is input to the transport unit 4. The transport motor 41 operates based on the input transport control signal, and the transport roller 42 is rotationally driven along with the operation of the transport motor 41, so that the medium P is transported along the transport direction.

Each of the plurality of head units 5 includes a head drive module 10 and a liquid discharge module 20. An image information signal IP output by the control unit 2 is input to the head unit 5, and the ink stored in the liquid container 3 is supplied to the head unit 5. The head drive module 10 controls the operation of the liquid discharge module 20 based on the image information signal IP input from the control unit 2, and the liquid discharge module 20 discharges the ink supplied from the liquid container 3 onto the medium P under the control of the head drive module 10.

In addition, the liquid discharge modules 20 included in the plurality of head units 5 are located side by side along the main scanning direction so as to be equal to or wider than a width of the medium P such that the ink can be discharged to the entire region in the width direction of the transported medium P. As a result, the liquid discharge apparatus 1 constitutes a line-type ink jet printer. The liquid discharge apparatus 1 is not limited to the line-type ink jet printer.

The cooling unit 6 has a duct 700 that is disposed inside the housing HS, and an intake fan FNi and an exhaust fan FNo that are disposed inside the duct 700. The cooling unit 6 cools the head drive module 10 disposed in the duct 700. The duct 700 has an intake port and an exhaust port (not illustrated in FIG. 1), and communicates with the outside of the housing HS via the intake port and the exhaust port. A cooling control signal is input to the intake fan FNi and the exhaust fan FNo from the control unit 2. The intake fan FNi and the exhaust fan FNo operate based on the input cooling control signal to generate an airflow in the duct 700. A part of the duct 700, such as the intake port and the exhaust port, may protrude to the outside of the housing HS.

Figure 2:
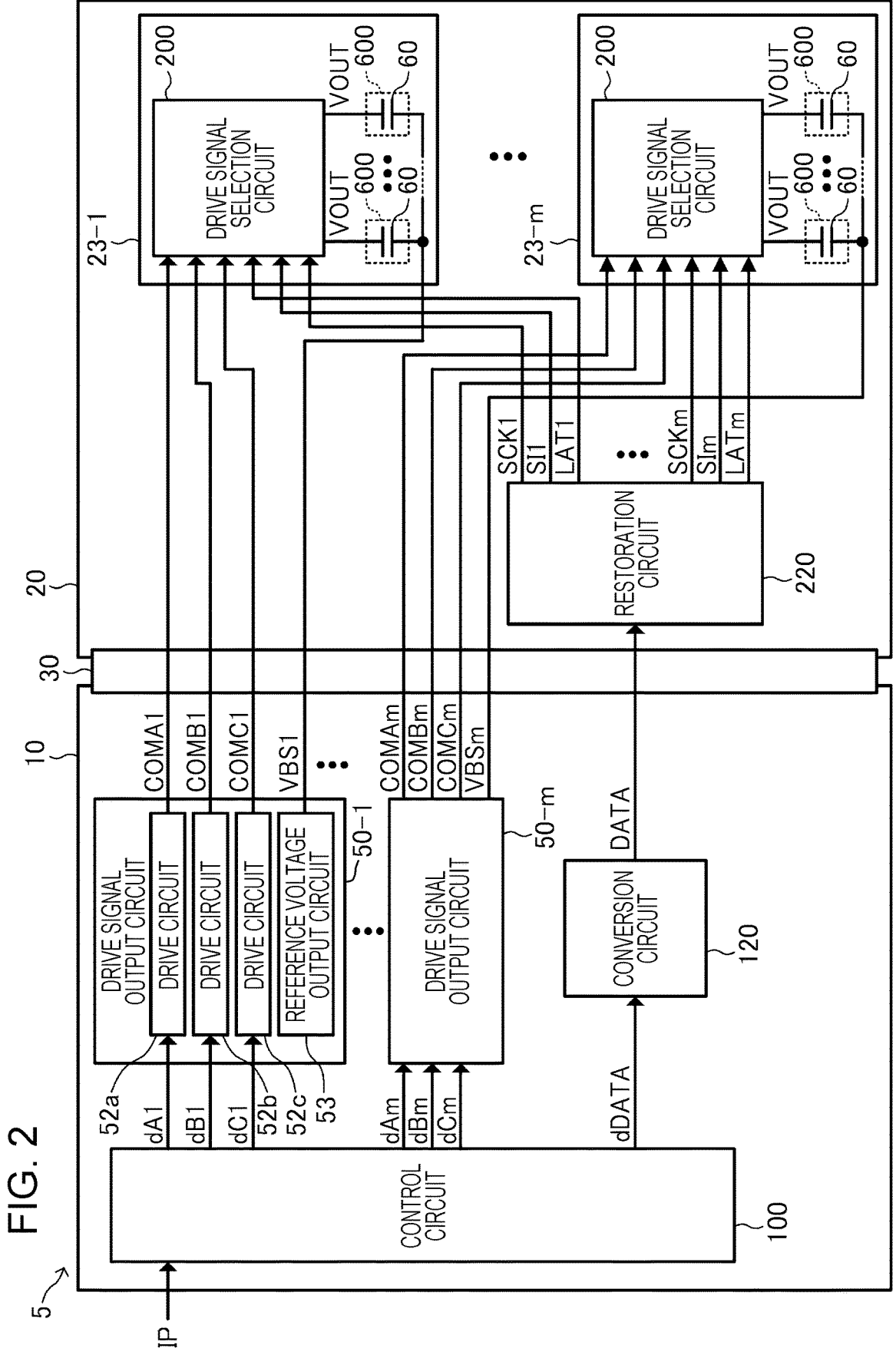
FIG. 2 is a diagram illustrating a schematic configuration of a head unit.

Next, a schematic configuration of the head unit 5 will be described. FIG. 2 is a diagram illustrating the schematic configuration of the head unit 5. As illustrated in FIG. 2, the head unit 5 includes the head drive module 10 and the liquid discharge module 20. In addition, in the head unit 5, the head drive module 10 and the liquid discharge module 20 are electrically coupled by one or a plurality of wiring members 30.

The wiring member 30 is a flexible member for electrically coupling the head drive module 10 and the liquid discharge module 20, such as flexible printed circuits (FPC).

The head drive module 10 includes a control circuit 100, drive signal output circuits 50-1 to 50-$m$, and a conversion circuit 120.

The control circuit 100 includes a CPU, FPGA, or the like. The image information signal IP output by the control unit 2 is input to the control circuit 100. The control circuit 100 outputs a signal for controlling each element of the head unit 5 based on the input image information signal IP.

The control circuit 100 generates a basic data signal dDATA for controlling the operation of the liquid discharge module 20 based on the image information signal IP, and outputs the basic data signal dDATA to the conversion circuit 120. The conversion circuit 120 converts the basic data signal dDATA into a differential signal such as low voltage differential signaling (LVDS), and outputs the differential signal to the liquid discharge module 20 as a data signal DATA. The conversion circuit 120 may convert the basic data signal dDATA into a differential signal of a high-speed transfer method such as low voltage positive emitter coupled logic (LVPECL) or current mode logic (CML) other than the LVDS, and output the differential signal to the liquid discharge module 20 as the data signal DATA. Alternatively, a part or all of the basic data signal dDATA may be output to the liquid discharge module 20 as a single-ended data signal DATA.

In addition, the control circuit 100 outputs basic drive signals dA1, dB1, and dC1 to the drive signal output circuit 50-1. The drive signal output circuit 50-1 includes drive circuits 52$a$, 52$b$, and 52$c$. The basic drive signal dA1 is input to the drive circuit 52$a$. The drive circuit 52$a$ generates a drive signal COMA1 by performing digital/analog conversion of the input basic drive signal dA1 and then performing amplification in class D, and outputs the drive signal COMA1 to the liquid discharge module 20. The basic drive signal dB1 is input to the drive circuit 52$b$. The drive circuit 52$b$ generates a drive signal COMB1 by performing digital/analog conversion of the input basic drive signal dB1 and then performing amplification in class D, and outputs the drive signal COMB1 to the liquid discharge module 20. The basic drive signal dC1 is input to the drive circuit 52$c$. The drive circuit 52$c$ generates a drive signal COMC1 by performing digital/analog conversion of the input basic drive signal dC1 and then performing amplification in class D, and outputs the drive signal COMC1 to the liquid discharge module 20.

Here, the drive circuits 52$a$, 52$b$, and 52$c$ need only to be able to generate the drive signals COMA1, COMB1, and COMC1 by amplifying waveforms defined by the input basic drive signals dA1, dB1, and dC1, respectively, and may include a class A amplifier circuit, a class B amplifier circuit, an AB amplifier circuit, or the like instead of a class D amplifier circuit or in addition to the class D amplifier circuit. In addition, the basic drive signals dA1, dB1, and dC1 need only to be able to define the waveforms of the corresponding drive signals COMA1, COMB1, and COMC1, respectively, and may be an analog signal.

In addition, the drive signal output circuit 50-1 includes a reference voltage output circuit 53. The reference voltage output circuit 53 generates a reference voltage signal VBS1 having a constant potential indicating a reference potential of a piezoelectric element 60, which will be described below, included in the liquid discharge module 20, and outputs the reference voltage signal VBS1 to the liquid discharge module 20. The reference voltage signal VBS1 may be, for example, a ground potential or a constant potential such as 5.5 V or 6 V. Here, the constant potential includes a case where it can be regarded as a substantially constant potential when a fluctuation due to an error, such as a fluctuation of the potential caused by an operation of a peripheral circuit, a fluctuation of the potential caused by variations in a circuit element, and a fluctuation of the potential caused by temperature characteristics of the circuit element, is taken into consideration.

The drive signal output circuits 50-2 to 50-*m* have the same configuration as the drive signal output circuit 50-1, except that the input signal and the output signal are different. That is, a drive signal output circuit 50-*j* (j is any one of 1 to m) includes circuits corresponding to the drive circuits 52*a*, 52*b*, and 52*c* and a circuit corresponding to the reference voltage output circuit 53, generates drive signals COMAj, COMBj, and COMCj based on basic drive signals dAj, dBj, and dCj input from the control circuit 100 and a reference voltage signal VBSj, and outputs the drive signals and the reference voltage signal to the liquid discharge module 20.

The liquid discharge module 20 includes a restoration circuit 220 and discharge modules 23-1 to 23-*m*.

The restoration circuit 220 restores the data signal DATA to a single-ended signal, separates the data signal DATA into signals corresponding to the discharge modules 23-1 to 23-*m*, and outputs the separated signals to the corresponding discharge modules 23-1 to 23-*m*.

Specifically, the restoration circuit 220 restores and separates the data signal DATA to generate a clock signal SCK1, a print data signal SI1, and a latch signal LAT1 corresponding to the discharge module 23-1, and outputs these signals to the discharge module 23-1. In addition, the restoration circuit 220 restores and separates the data signal DATA to generate a clock signal SCKj, a print data signal SIj, and a latch signal LATj corresponding to a discharge module 23-*j*, and outputs these signals to a discharge module 23-*j*.

As described above, the restoration circuit 220 restores the data signal DATA as the differential signal output by the head drive module 10, and separates the restored signal into the signals corresponding to the discharge modules 23-1 to 23-*m*. As a result, the restoration circuit 220 generates clock signals SCK1 to SCKm, print data signals SI1 to SIm, and latch signals LAT1 to LATm corresponding to the discharge modules 23-1 to 23-*m*, and outputs these signals to the corresponding discharge modules 23-1 to 23-*m*. Any one of the clock signals SCK1 to SCKm, the print data signals SI1 to SIm, and the latch signals LAT1 to LATm corresponding to the discharge modules 23-1 to 23-*m*, which are output by the restoration circuit 220, may be a common signal for the discharge modules 23-1 to 23-*m*.

Here, in view of the fact that the restoration circuit 220 generates the clock signals SCK1 to SCKm, the print data signals SI1 to SIm, and the latch signals LAT1 to LATm by restoring and separating the data signal DATA, the data signal DATA is a differential signal corresponding to the clock signals SCK1 to SCKm, the print data signals SI1 to SIm, and the latch signals LAT1 to LATm. In addition, the basic data signal dDATA on which the data signal DATA is based includes signals corresponding to the clock signals SCK1 to SCKm, the print data signals SI1 to SIm, and the latch signals LAT1 to LATm. That is, the basic data signal dDATA includes signals for controlling operations of the discharge modules 23-1 to 23-*m* included in the liquid discharge module 20.

The discharge module 23-1 includes a drive signal selection circuit 200 and a plurality of discharge sections 600. Each of the plurality of discharge sections 600 includes the piezoelectric element 60 as a drive element, and discharges the ink onto the medium P based on the drive signals COMA1, COMB1, and COMC1 input to the discharge module 23-1.

Specifically, the drive signals COMA1, COMB1, and COMC1, the reference voltage signal VBS1, the clock signal SCK1, the print data signal SI1, and the latch signal LAT1 are input to the discharge module 23-1. The drive signals COMA1, COMB1, and COMC1, the clock signal SCK1, the print data signal SI1, and the latch signal LAT1 are input to the drive signal selection circuit 200 included in the discharge module 23-1. The drive signal selection circuit 200 generates a drive signal VOUT by selecting or not selecting each of the drive signals COMA1, COMB1, and COMC1 based on the input clock signal SCK1, print data signal SI1, and latch signal LAT1, and supplies the drive signal VOUT to one end of the piezoelectric element 60 included in the corresponding discharge section 600. At this time, the reference voltage signal VBS1 is supplied to the other end of the piezoelectric element 60. The piezoelectric element 60 is driven by a potential difference between the drive signal VOUT supplied to the one end and the reference voltage signal VBS1 supplied to the other end, so that an ink is discharged from the corresponding discharge section 600.

Similarly, the discharge module 23-*j* includes a drive signal selection circuit 200 and a plurality of discharge sections 600. In addition, each of the plurality of discharge sections 600 includes the piezoelectric element 60 as a drive element, and discharges the ink onto the medium P based on the drive signals COMAj, COMBj, and COMCj input to the discharge module 23-*j*.

Specifically, the drive signals COMAj, COMBj, and COMCj, the reference voltage signal VBSj, the clock signal SCKj, the print data signal SIj, and the latch signal LATj are input to the discharge module 23-*j*. The drive signals COMAj, COMBj, and COMCj, the clock signal SCKj, the print data signal SIj, and the latch signal LATj are input to the drive signal selection circuit 200 included in the discharge module 23-*j*. The drive signal selection circuit 200 generates a drive signal VOUT by selecting or not selecting each of the drive signals COMAj, COMBj, and COMCj based on the input clock signal SCKj, print data signal SIj, and latch signal LATj, and supplies the drive signal VOUT to one end of the piezoelectric element 60 included in the corresponding discharge section 600. At this time, the reference voltage signal VBSj is supplied to the other end of the piezoelectric element 60. The piezoelectric element 60 is driven by a potential difference between the drive signal VOUT supplied to the one end and the reference voltage signal VBSj supplied to the other end, so that an ink is discharged from the corresponding discharge section 600.

In the liquid discharge apparatus 1 of the first embodiment configured as described above, the control unit 2 controls the transport of the medium P by the transport unit 4, and controls the discharge of the ink from the liquid discharge module 20 included in the head unit 5, based on the image data supplied from a host computer or the like (not illustrated). As a result, the liquid discharge apparatus 1 can land a desired amount of ink at a desired position on the medium P, and forms a desired image on the medium P.

Here, the discharge modules 23-1 to 23-$m$ included in the liquid discharge module 20 have the same configuration except that the input signals are different. Therefore, in the following description, when it is not necessary to distinguish the discharge modules 23-1 to 23-$m$, the discharge modules 23-1 to 23-$m$ may be simply referred to as a discharge module 23. In addition, in this case, the drive signals COMA1 to COMAm input to the discharge module 23 may be referred to as a drive signal COMA, the drive signals COMB1 to COMBm may be referred to as a drive signal COMB, and the drive signals COMC1 to COMCm may be referred to as a drive signal COMC. Similarly, the reference voltage signals VBS1 to VBSm may be referred to as a reference voltage signal VBS, the clock signals SCK1 to SCKm may be referred to as a clock signal SCK, the print data signals SI1 to SIm may be referred to as a print data signal SI, and the latch signals LAT1 to LATm may be referred to as a latch signal LAT.

That is, the drive signals COMA, COMB, and COMC, the reference voltage signal VBS, the clock signal SCK, the print data signal SI, and the latch signal LAT are input to the discharge module 23. The drive signals COMA, COMB, and COMC, the clock signal SCK, the print data signal SI, and the latch signal LAT are input to the drive signal selection circuit 200 included in the discharge module 23. The drive signal selection circuit 200 generates a drive signal VOUT by selecting or not selecting each of the drive signals COMA, COMB, and COMC based on the input clock signal SCK, print data signal SI, and latch signal LAT, and supplies the drive signal VOUT to one end of the piezoelectric element 60 included in the corresponding discharge section 600. At this time, the reference voltage signal VBS is supplied to the other end of the piezoelectric element 60. The piezoelectric element 60 is driven by a potential difference between the drive signal VOUT supplied to the one end and the reference voltage signal VBS supplied to the other end, so that an ink is discharged from the corresponding discharge section 600.

2. Functional Configuration of Drive Signal Selection Circuit

Next, a configuration and operation of the drive signal selection circuit 200 included in the discharge module 23 will be described. In describing the configuration and operation of the drive signal selection circuit 200 included in the discharge module 23, first, an example of signal waveforms included in the drive signals COMA, COMB, and COMC input to the drive signal selection circuit 200 will be described.

Figure 3:
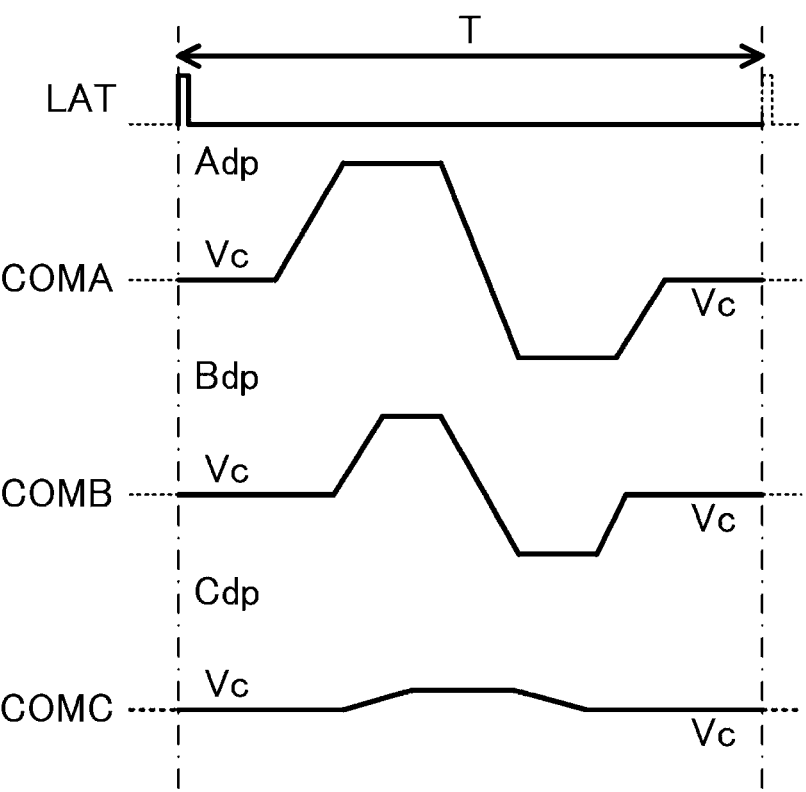
FIG. 3 is a diagram illustrating an example of a signal waveform of a drive signal.

FIG. 3 is a diagram illustrating an example of the signal waveforms of the drive signals COMA, COMB, and COMC. As illustrated in FIG. 3, the drive signal COMA includes a trapezoidal waveform Adp arranged in a cycle T from the rise of the latch signal LAT to the next rise of the latch signal LAT. The trapezoidal waveform Adp is a signal waveform that is supplied to one end of the piezoelectric element 60 to discharge a predetermined amount of ink from the discharge section 600 corresponding to the piezoelectric element 60. The drive signal COMB includes a trapezoidal waveform Bdp arranged in the cycle T. This trapezoidal waveform Bdp is a signal waveform whose voltage amplitude is smaller than that of the trapezoidal waveform Adp, and is a signal waveform that is supplied to one end of the piezoelectric element 60 to discharge a smaller amount of ink than a predetermined amount from the discharge section 600 corresponding to the piezoelectric element 60. The drive signal COMC includes a trapezoidal waveform Cdp arranged in the cycle T. This trapezoidal waveform Cdp is a signal waveform whose voltage amplitude is smaller than that of the trapezoidal waveforms Adp and Bdp, and is a signal waveform that is supplied to one end of the piezoelectric element 60 to vibrate the ink in the vicinity of a nozzle opening portion to the extent that the ink is not discharged from the discharge section 600 corresponding to the piezoelectric element 60. The trapezoidal waveform Cdp is supplied to the piezoelectric element 60 to vibrate the ink in the vicinity of the nozzle opening portion of the discharge section 600 including the piezoelectric element 60. As a result, a possibility of increasing a viscosity of the ink in the vicinity of the nozzle opening portion is reduced.

That is, the drive signal COMA is a signal for driving the piezoelectric element 60 so that the ink is discharged, the drive signal COMB is a signal for driving the piezoelectric element 60 so that the ink is discharged, and the drive signal COMC is a signal for driving the piezoelectric element 60 so that the ink is not discharged. An amount of the ink discharged from the liquid discharge module 20 including the discharge module 23 when such a drive signal COMA is supplied to the piezoelectric element 60 is different from an amount of the ink discharged from the liquid discharge module 20 including the discharge module 23 when such a drive signal COMB is supplied to the piezoelectric element 60.

In addition, at a start timing and at an end timing of each of the trapezoidal waveforms Adp, Bdp, and Cdp, all of voltage values of the trapezoidal waveforms Adp, Bdp, and Cdp are a voltage Vc in common. That is, each of the trapezoidal waveforms Adp, Bdp, and Cdp is a signal waveform that starts at the voltage Vc and ends at the voltage Vc.

Here, in the following description, when the trapezoidal waveform Adp is supplied to one end of the piezoelectric element 60, the amount of the ink discharged from the discharge section 600 corresponding to the piezoelectric element 60 may be referred to as a large amount, and, when the trapezoidal waveform Bdp is supplied to one end of the piezoelectric element 60, the amount of the ink discharged from the discharge section 600 corresponding to the piezoelectric element 60 may be referred to as a small amount. In addition, when the trapezoidal waveform Cdp is supplied to one end of the piezoelectric element 60, vibrating the ink in the vicinity of the nozzle opening portion to the extent that the ink is not discharged from the discharge section 600 corresponding to the piezoelectric element 60 may be referred to as micro-vibration.

Although FIG. 3 illustrates a case where each of the drive signals COMA, COMB, and COMC includes one trapezoidal waveform in the cycle T, each of the drive signals COMA, COMB, and COMC may include two or more consecutive trapezoidal waveforms in the cycle T. In this case, a signal defining a switching timing of two or more trapezoidal waveforms is input to the drive signal selection circuit 200, and the discharge section 600 discharges the ink a plurality of times in the cycle T. The ink discharged in the plurality of times in the cycle T lands on the medium P and is combined to form one dot on the medium P. As a result, the number of gradations of dots formed on the medium P can be increased.

On the other hand, in the liquid discharge apparatus 1 described in the first embodiment, the description is made on the assumption that the drive signals COMA, COMB, and COMC are signals including one trapezoidal waveform in the cycle T. As a result, the cycle T for forming dots on the medium P can be shortened, a speed of image formation on the medium P can be increased. In addition, the drive signals COMA, COMB, and COMC are supplied to the liquid discharge module 20 in parallel, so that the number of gradations of dots formed on the medium P is also increased. Here, the cycle T from the rise of the latch signal LAT to the next rise of the latch signal LAT may be referred to as a dot formation cycle for forming dots with a desired size on the medium P.

The signal waveforms included in the drive signals COMA, COMB, and COMC are not limited to the signal waveforms exemplified in FIG. 3, and various signal waveforms may be used depending on a type of the ink discharged from the discharge section 600, the number of the piezoelectric elements 60 driven by the drive signals COMA, COMB, and COMC, a length of a wiring through which the drive signals COMA, COMB, and COMC are propagated, and the like. That is, the drive signals COMA1 to COMAm illustrated in FIG. 2 may include signal waveforms different from each other, and similarly, the drive signals COMB1 to COMBm and the drive signals COMC1 to COMCm may include signal waveforms different from each other.

Figure 4:
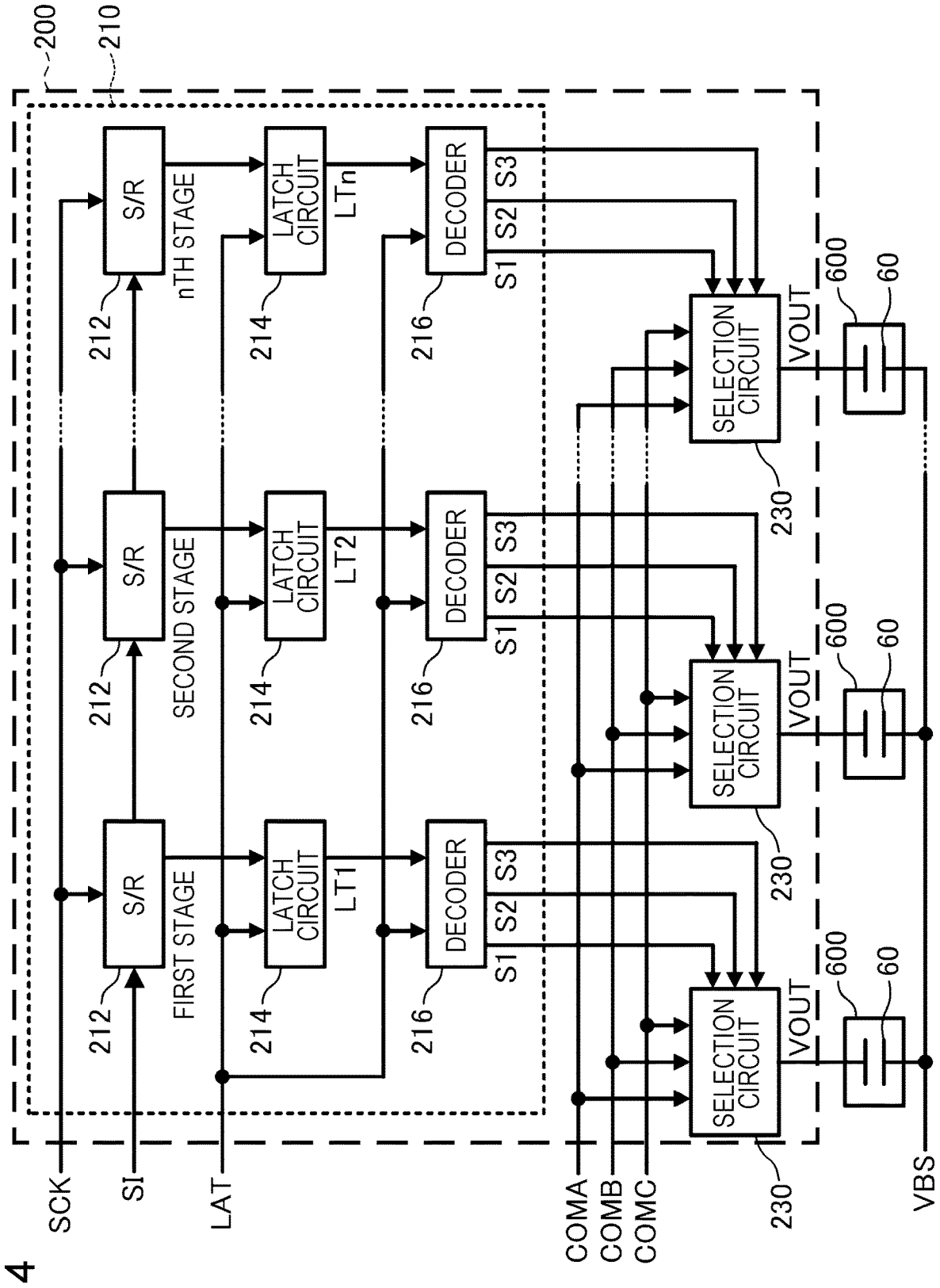
FIG. 4 is a diagram illustrating a functional configuration of a drive signal selection circuit.

Next, a configuration and operation of the drive signal selection circuit 200 that outputs the drive signal VOUT by selecting or not selecting each of the drive signals COMA, COMB, and COMC will be described. FIG. 4 is a diagram illustrating a functional configuration of the drive signal selection circuit 200. As illustrated in FIG. 4, the drive signal selection circuit 200 includes a selection control circuit 210 and a plurality of selection circuits 230.

The print data signal SI, the latch signal LAT, and the clock signal SCK are input to the selection control circuit 210. In addition, the selection control circuit 210 includes a set of a shift register (S/R) 212, a latch circuit 214, and a decoder 216 corresponding to each of n discharge sections 600. That is, the drive signal selection circuit 200 includes n shift registers 212, n latch circuits 214, and n decoders 216, each of which is the same as the total number of discharge sections 600.

The print data signal SI is a signal synchronized with the clock signal SCK, and includes 2-bit print data [SIH, SIL] for defining the dot size formed by the ink discharged from each of the n discharge sections 600 as any of "large dot LD", "small dot SD", "non-discharge ND", and "micro-vibration BSD". This print data signal SI is held in the shift register 212 corresponding to the discharge section 600 for each 2-bit print data [SIH, SIL].

Specifically, the n shift registers 212 corresponding to the discharge sections 600 are cascade-coupled to each other. The print data signal SI that is serially input is sequentially transferred to a subsequent stage of the shift register 212 cascade-coupled according to the clock signal SCK. When the supply of the clock signal SCK is stopped, the n shift registers 212 holds the 2-bit print data [SIH, SIL] corresponding to the discharge section 600 corresponding to the shift register 212. In FIG. 4, in order to distinguish the n cascade-coupled shift registers 212, the shift registers 212 are denoted by as first stage, second stage, . . . , nth stage from the upstream to the downstream where the print data signal SI is input.

Each of the n latch circuits 214 latches simultaneously the 2-bit print data [SIH, SIL] held by the corresponding shift register 212 at the rise of the latch signal LAT.

Figures 5, 6:
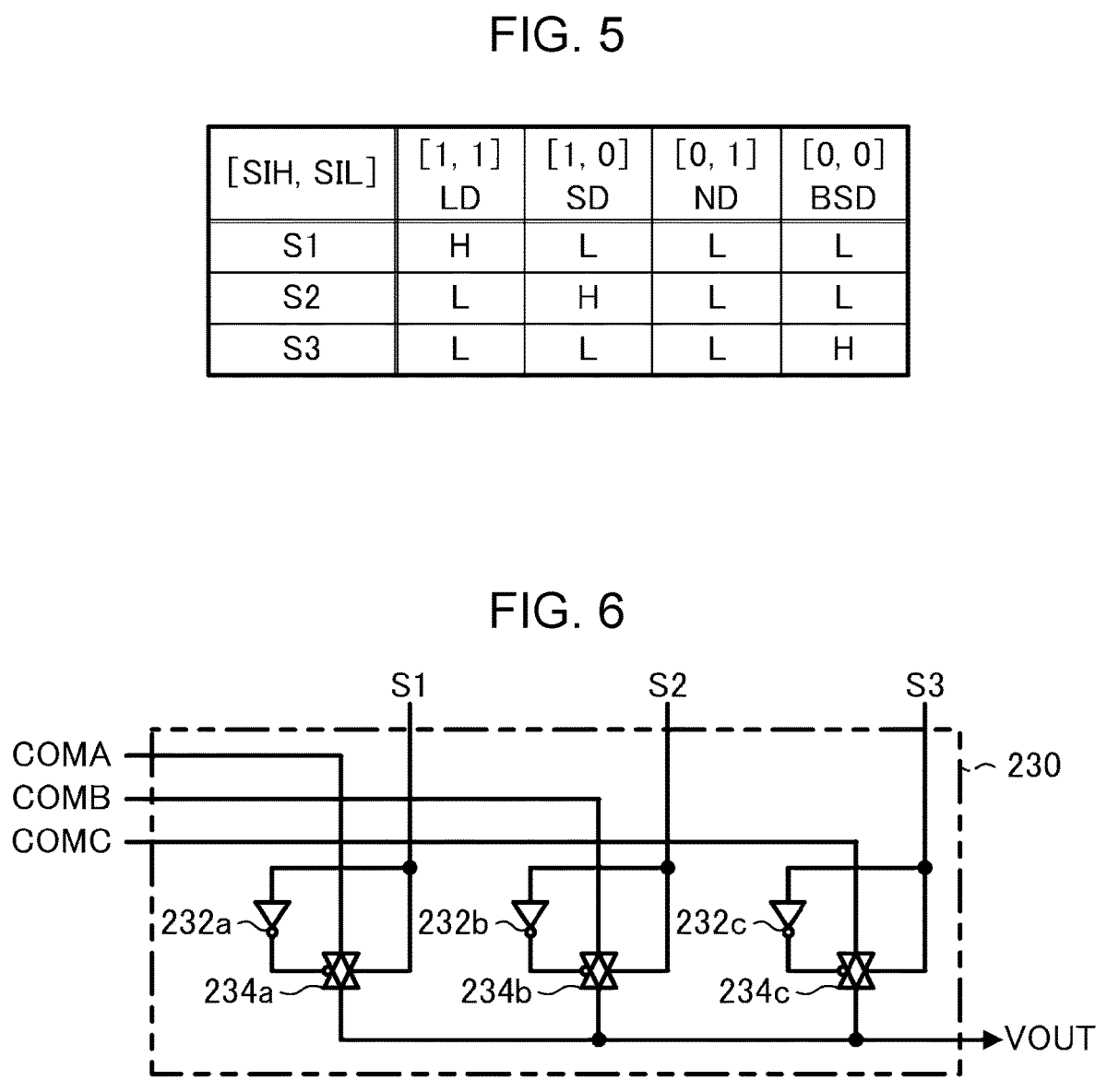

Each of the n decoders 216 decodes the 2-bit print data [SIH, SIL] latched by the corresponding latch circuit 214, and outputs logic level selection signals S1, S2, and S3 according to the decoding content for each cycle T. FIG. 5 is a table illustrating an example of the decoding content in the decoder 216. The decoder 216 outputs the logic level selection signals S1, S2, and S3 defined by the latched 2-bit print data [SIH, SIL] and the decoding content illustrated in FIG. 5. For example, when the 2-bit print data [SIH, SIL] latched by the corresponding latch circuit 214 is [1, 0], the decoder 216 according to the first embodiment sets the logic levels of the selection signals S1, S2, and S3 to L, H, and L levels, respectively, in the cycle T.

The selection circuit 230 is provided corresponding to each of the n discharge sections 600. That is, the drive signal selection circuit 200 includes n selection circuits 230. The selection signals S1, S2, and S3 output by the decoder 216 corresponding to the same discharge section 600 and the drive signals COMA, COMB, and COMC are input to the selection circuit 230. The selection circuit 230 generates a drive signal VOUT by selecting or not selecting each of the drive signals COMA, COMB, and COMC based on the selection signals S1, S2, and S3 and the drive signals COMA, COMB, and COMC, and outputs the drive signal VOUT to the corresponding discharge section 600.

FIG. 6 is a diagram illustrating an example of a configuration of the selection circuit 230 corresponding to one discharge section 600. As illustrated in FIG. 6, the selection circuit 230 includes inverters 232a, 232b, and 232c and transfer gates 234a, 234b, and 234c.

The selection signal S1 is input to a positive control end not marked with a circle at the transfer gate 234a, while being logically inverted by the inverter 232a and input to a negative control end marked with a circle at the transfer gate 234a. In addition, the drive signal COMA is supplied to an input terminal of the transfer gate 234a. The transfer gate 234a is conductive between the input terminal and an output terminal when the input selection signal S1 is H level, and is non-conductive between the input terminal and the output terminal when the input selection signal S1 is L level. That is, the transfer gate 234a outputs the drive signal COMA to the output terminal when the selection signal S1 is H level, and does not output the drive signal COMA to the output terminal when the selection signal S1 is L level.

The selection signal S2 is input to a positive control end not marked with a circle at the transfer gate 234b, while being logically inverted by the inverter 232b and input to a negative control end marked with a circle at the transfer gate 234b. In addition, the drive signal COMB is supplied to an input terminal of the transfer gate 234b. The transfer gate 234b is conductive between the input terminal and an output terminal when the input selection signal S2 is H level, and is non-conductive between the input terminal and the output terminal when the input selection signal S2 is L level. That is, the transfer gate 234b outputs the drive signal COMB to the output terminal when the selection signal S2 is H level, and does not output the drive signal COMB to the output terminal when the selection signal S2 is L level.

The selection signal S3 is input to a positive control end not marked with a circle at the transfer gate 234c, while being logically inverted by the inverter 232c and input to a negative control end marked with a circle at the transfer gate 234c. In addition, the drive signal COMC is supplied to an input terminal of the transfer gate 234c. The transfer gate 234c is conductive between the input terminal and an output terminal when the input selection signal S3 is H level, and is non-conductive between the input terminal and the output terminal when the input selection signal S3 is L level. That is, the transfer gate 234c outputs the drive signal COMC to the output terminal when the selection signal S3 is H level, and does not output the drive signal COMC to the output terminal when the selection signal S3 is L level.

The output terminals of the transfer gates 234a, 234b, and 234c are commonly coupled. That is, the drive signals COMA, COMB, and COMC selected or not selected based on the selection signals S1, S2, and S3 are supplied to the output terminals of the transfer gates 234a, 234b, and 234c commonly coupled. The selection circuit 230 outputs the signal supplied to the commonly coupled output terminals to the corresponding discharge section 600 as the drive signal VOUT.

Figure 7:
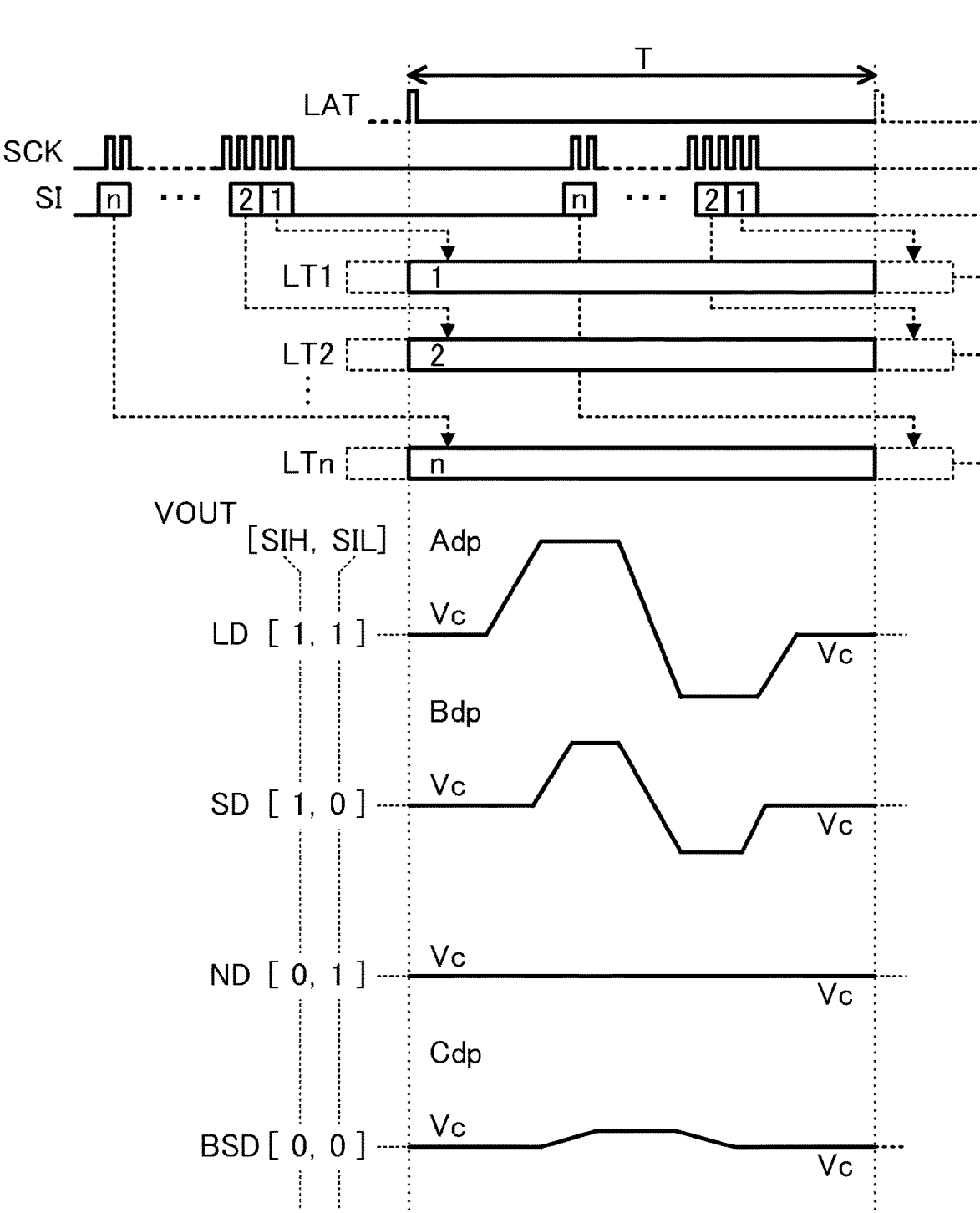
FIG. 7 is a diagram for describing an operation of the drive signal selection circuit.

An operation of the drive signal selection circuit 200 will be described. FIG. 7 is a diagram for describing the operation of the drive signal selection circuit 200. The print data signal SI is serially input in synchronization with the clock signal SCK, and is sequentially transferred by the shift register 212 corresponding to the discharge section 600. When the input of the clock signal SCK is stopped, the 2-bit print data [SIH, SIL] corresponding to each of the discharge sections 600 is held in the corresponding shift register 212.

Thereafter, when the latch signal LAT rises, the 2-bit print data [SIH, SIL] held in the shift register 212 are simultaneously latched by the latch circuit 214. In FIG. 7, the 2-bit print data [SIH, SIL], which are latched by the latch circuit 214, corresponding to first stage, second stage, . . . , nth stage shift registers 212 are illustrated as LT1, LT2, . . . , LTn.

The decoder 216 outputs the logic level selection signals S1, S2, and S3 according to the dot size defined by the latched 2-bit print data [SIH, SIL].

Specifically, when the print data [SIH, SIL] is [1, 1], the decoder 216 outputs the logic levels of the selection signals S1, S2, and S3 as H, L, and L levels, respectively, to the selection circuit 230 in the cycle T. As a result, the selection circuit 230 selects the trapezoidal waveform Adp in the cycle T, and outputs the drive signal VOUT corresponding to the "large dot LD". In addition, when the print data [SIH, SIL] is [1, 0], the decoder 216 outputs the logic levels of the selection signals S1, S2, and S3 as L, H, and L levels, respectively, to the selection circuit 230 in the cycle T. As a result, the selection circuit 230 selects the trapezoidal waveform Bdp in the cycle T, and outputs the drive signal VOUT corresponding to the "small dot SD". In addition, when the print data [SIH, SIL] is [0, 1], the decoder 216 outputs the logic levels of the selection signals S1, S2, and S3 as L, L, and L levels, respectively, to the selection circuit 230 in the cycle T. As a result, the selection circuit 230 selects none of the trapezoidal waveforms Adp, Bdp, and Cdp in the cycle T, and outputs the drive signal VOUT corresponding to a constant "non-discharge ND" at the voltage Vc. In addition, when the print data [SIH, SIL] is [0, 0], the decoder 216 outputs the logic levels of the selection signals S1, S2, and S3 as L, L, and H levels, respectively, to the selection circuit 230 in the cycle T. As a result, the selection circuit 230 selects the trapezoidal waveform Cdp in the cycle T, and outputs the drive signal VOUT corresponding to the "micro-vibration BSD".

Here, when the selection circuit 230 selects none of the trapezoidal waveforms Adp, Bdp, and Cdp, at one end of the corresponding piezoelectric element 60, the voltage Vc supplied immediately before to the piezoelectric element 60 is held by a capacitive component of the piezoelectric element 60. That is, the fact that the selection circuit 230 outputs a constant drive signal VOUT at the voltage Vc includes a case where the immediately-before voltage Vc held by the capacitive component of the piezoelectric element 60 is supplied to the piezoelectric element 60 as the drive signal VOUT, when none of the trapezoidal waveforms Adp, Bdp, and Cdp is selected as the drive signal VOUT.

As described above, the drive signal selection circuit 200 generates a drive signal VOUT corresponding to each of the plurality of discharge sections 600 by selecting or not selecting the drive signals COMA, COMB, and COMC based on the print data signal SI, the latch signal LAT, and the clock signal SCK, and outputs the drive signal VOUT to the corresponding discharge section 600. As a result, the amount of the ink discharged from each of the plurality of discharge sections 600 is individually controlled.

3. Configuration of Liquid Discharge Module

Figure 8:
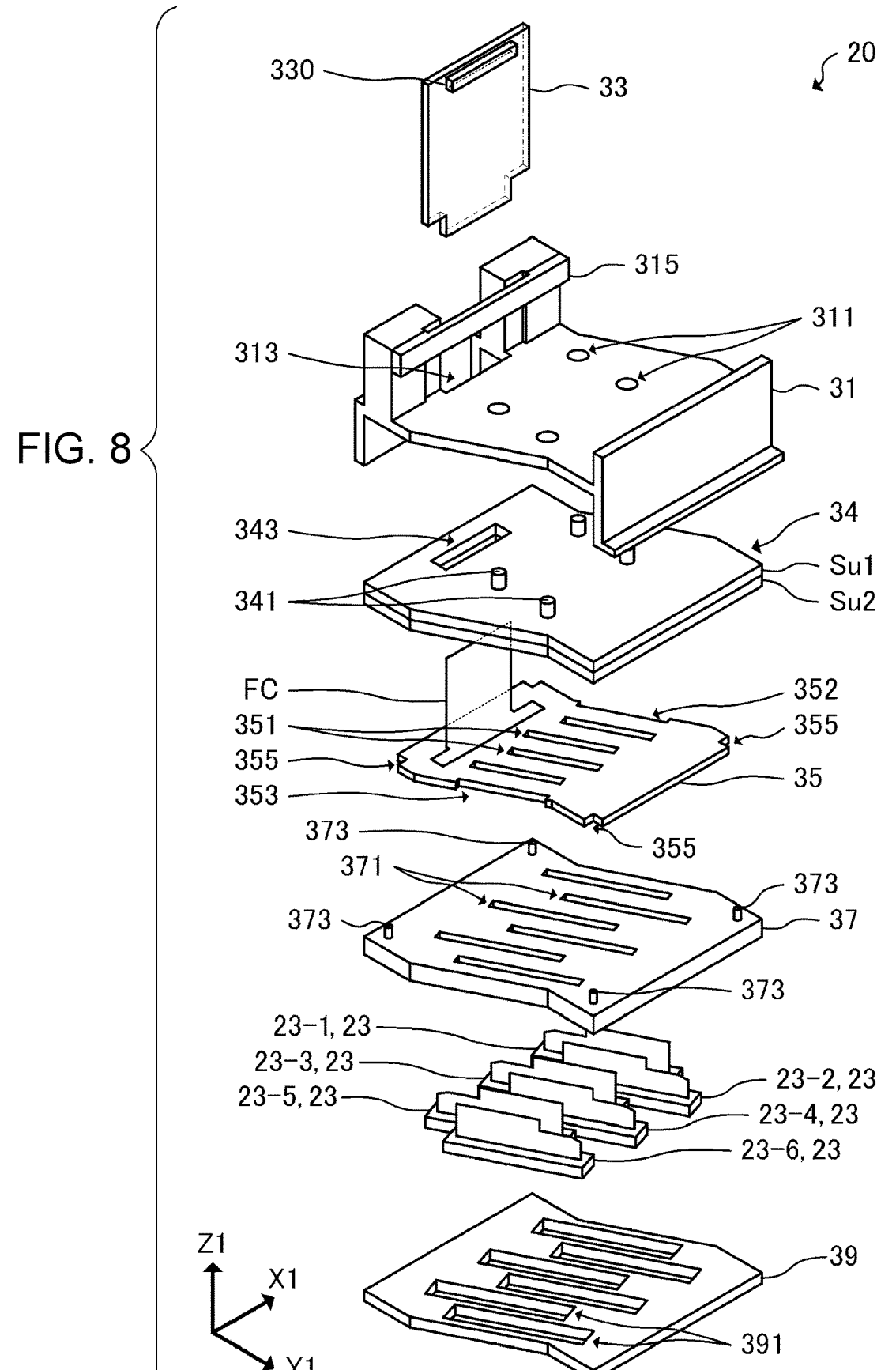
FIG. 8 is a diagram illustrating a structure of a liquid discharge module.
Figure 9:
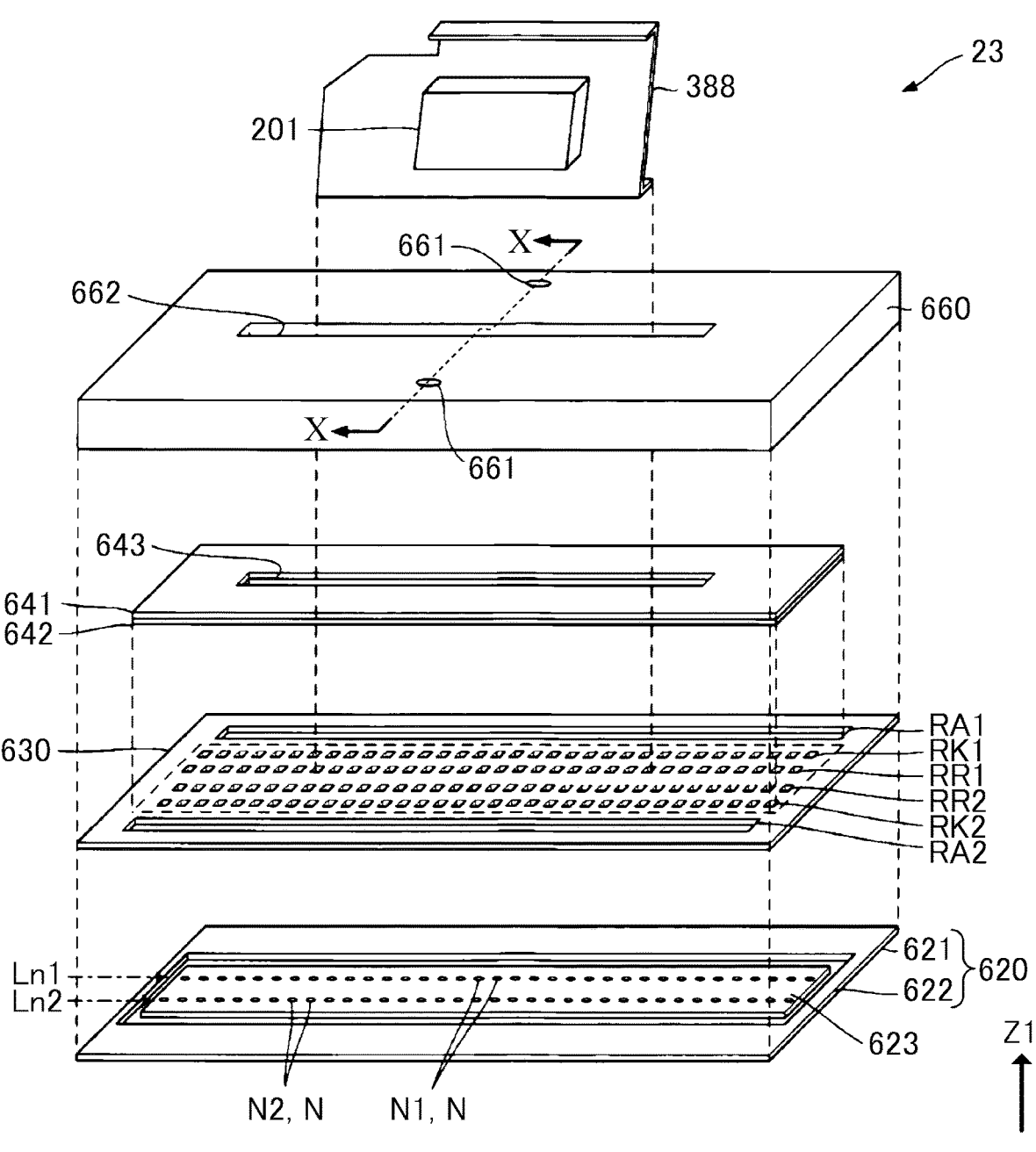
FIG. 9 is a diagram illustrating an example of a structure of a discharge module.
Figure 10:
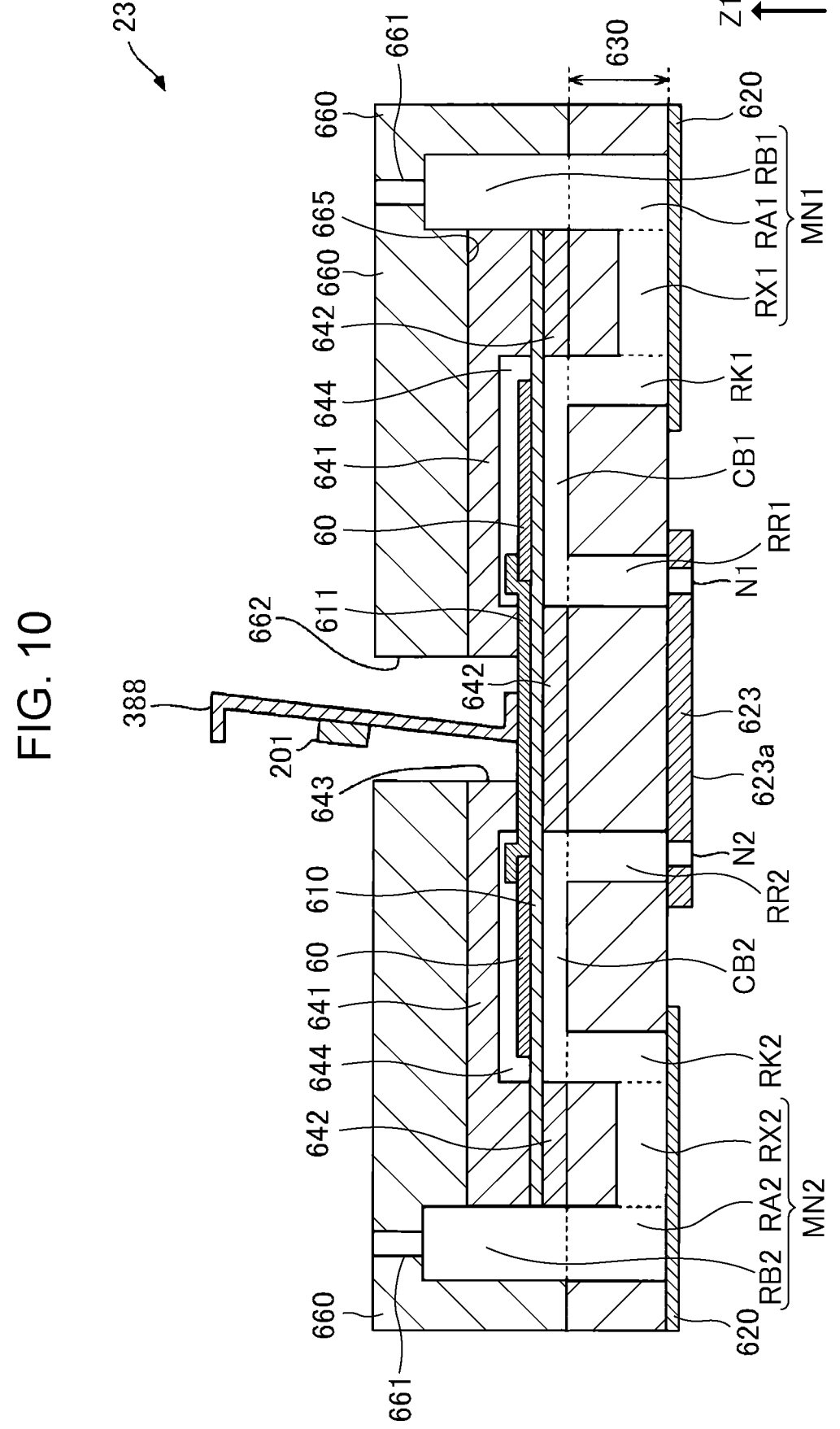
FIG. 10 is a cross-sectional view of the discharge module when the discharge module is cut along the line X-X illustrated in FIG. 9.

Next, a structure of the liquid discharge module 20 will be described with reference to FIGS. 8 to 10. FIG. 8 is a diagram illustrating the structure of the liquid discharge module 20. Here, in describing the structure of the liquid discharge module 20, FIGS. 8 to 10 illustrate arrows indicating an X1 direction, a Y1 direction, and a Z1 direction orthogonal to each other. In addition, in the description of FIGS. 8 to 10, a starting point side of the arrow indicating the X1 direction may be referred to as a −X1 side, a tip end side thereof may be referred to as a +X1 side, a starting point side of the arrow indicating the Y1 direction may be referred to as a −Y1 side, a tip end side thereof may be referred to as a +Y1 side, a starting point side of the arrow indicating the Z1 direction may be referred to as a −Z1 side, and a tip end side thereof may be referred to as a +Z1 side. In addition, in the following description, the liquid discharge module 20 included in the liquid discharge apparatus 1 according to the first embodiment will be described as having six discharge modules 23, and, when distinguishing between the six discharge modules 23, the discharge modules 23 may be referred to as discharge modules 23-1 to 23-6.

The liquid discharge module 20 includes a housing 31, an aggregate substrate 33, a flow path structure 34, a head substrate 35, a distribution flow path 37, a fixing plate 39, and discharge modules 23-1 to 23-6. In the liquid discharge module 20, the flow path structure 34, the head substrate 35, the distribution flow path 37, and the fixing plate 39 are laminated in the order of the fixing plate 39, the distribution flow path 37, the head substrate 35, and the flow path structure 34 from the −Z1 side to the +Z1 side along the Z1 direction, and the housing 31 is located around the flow path structure 34, the head substrate 35, the distribution flow path 37, and the fixing plate 39 so as to support the flow path structure 34, the head substrate 35, the distribution flow path 37, and the fixing plate 39. The aggregate substrate 33 is erected on the +Z1 side of the housing 31 in a state of being held by the housing 31, and the six discharge modules 23 are located between the distribution flow path 37 and the fixing plate 39 such that a part of the six discharge modules 23 is exposed to an outside of the liquid discharge module 20.

In describing the structure of the liquid discharge module 20, first, a structure of the discharge module 23 included in the liquid discharge module 20 will be described. FIG. 9 is a diagram illustrating an example of the structure of the discharge module 23. In addition, FIG. 10 is a diagram illustrating an example of a cross section of the discharge module 23. Here, FIG. 10 is a cross-sectional view of the discharge module 23 illustrated in FIG. 9 when the discharge module 23 is cut along the line X-X illustrated in FIG. 9, and the line X-X illustrated in FIG. 9 is an imaginary line segment that passes through an introduction path 661 of the discharge module 23 and passes through a nozzle N1 and a nozzle N2.

As illustrated in FIGS. 9 and 10, the discharge module 23 includes a plurality of nozzles N1 arranged side by side and a plurality of nozzles N2 arranged side by side. The total number of the nozzles N1 and the nozzles N2 included in the discharge module 23 is n, which is the same as the number of the discharge sections 600 included in the discharge module 23. In the first embodiment, the number of the nozzles N1 and the number of the nozzles N2 included in the discharge module 23 will be described as being the same. That is, the discharge module 23 will be described as having n/2 nozzles N1 and n/2 nozzles N2. Here, when it is not necessary to distinguish between the nozzle N1 and the nozzle N2 in the following description, the nozzles may be simply referred to as a nozzle N.

The discharge module 23 includes a wiring member 388, a case 660, a protective substrate 641, a flow path formation substrate 642, a communication plate 630, a compliance substrate 620, and a nozzle plate 623.

On the flow path formation substrate 642, pressure chambers CB1, which are partitioned by a plurality of partition walls by anisotropic etching from one surface side, are arranged side by side corresponding to the nozzle N1, and pressure chambers CB2, which are partitioned by a plurality of partition walls by anisotropic etching from one surface side, are arranged side by side corresponding to the nozzle N2. Here, in the following description, when it is not necessary to distinguish between the pressure chamber CB1 and the pressure chamber CB2, the pressure chambers CB1 and CB2 may be simply referred to as a pressure chamber CB.

The nozzle plate 623 is located on the −Z1 side of the flow path formation substrate 642. The nozzle plate 623 is provided with a nozzle row Ln1 formed by n/2 nozzles N1 and a nozzle row Ln2 formed by n/2 nozzles N2. Here, in the following description, a surface on the −Z1 side of the nozzle plate 623 to which the nozzle N is open may be referred to as a liquid ejection surface 623a.

The communication plate 630 is located on the −Z1 side of the flow path formation substrate 642 and on the +Z1 side of the nozzle plate 623. The communication plate 630 is provided with a nozzle communication path RR1 through which the pressure chamber CB1 communicates with the nozzle N1, and a nozzle communication path RR2 through which the pressure chamber CB2 communicates with the nozzle N2. In addition, in the communication plate 630, a pressure chamber communication path RK1 through which an end portion of the pressure chamber CB1 communicates with a manifold MN1, and a pressure chamber communication path RK2 through which an end portion of the pressure chamber CB2 communicates with a manifold MN2 are independently provided corresponding to the pressure chambers CB1 and CB2, respectively.

The manifold MN1 includes a supply communication path RA1 and a coupling communication path RX1. The supply communication path RA1 is provided so as to penetrate the communication plate 630 along the Z1 direction, and the coupling communication path RX1 is provided halfway in the Z1 direction to be open to a side of the nozzle plate 623 of the communication plate 630 without penetrating the communication plate 630 in the Z1 direction. Similarly, the manifold MN2 includes a supply communication path RA2 and a coupling communication path RX2. The supply communication path RA2 is provided so as to penetrate the communication plate 630 along the Z1 direction, and the coupling communication path RX2 is provided halfway in the Z1 direction to be open to a side of the nozzle plate 623 of the communication plate 630 without penetrating the communication plate 630 in the Z1 direction. The coupling communication path RX1 included in the manifold MN1 communicates with the corresponding pressure chamber CB1 by the pressure chamber communication path RK1, and the coupling communication path RX2 included in the manifold MN2 communicates with the corresponding pressure chamber CB2 by the pressure chamber communication path RK2.

Here, in the following description, when it is not necessary to distinguish between the nozzle communication path RR1 and the nozzle communication path RR2, the nozzle communication path RR1 and the nozzle communication path RR2 may be simply referred to as a nozzle communication path RR, and when it is not necessary to distinguish between the manifold MN1 and the manifold MN2, the manifold MN1 and the manifold MN2 may be simply referred to as a manifold MN. Similarly, when it is not necessary to distinguish between the supply communication path RA1 and the supply communication path RA2, the supply communication path RA1 and the supply communication path RA2 may be simply referred to as a supply communication path RA, and when it is not necessary to distinguish between the coupling communication path RX1 and the coupling communication path RX2, the coupling communication path RX1 and the coupling communication path RX2 may be simply referred to as a coupling communication path RX.

A diaphragm 610 is located on a surface on the +Z1 side of the flow path formation substrate 642. In addition, two rows of the piezoelectric elements 60 are formed corresponding to the nozzles N1 and N2 on a surface on the +Z1 side of the diaphragm 610. One electrode of the piezoelectric element 60 and a piezoelectric layer are formed for each pressure chamber CB, and the other electrode of the piezoelectric element 60 is configured as a common electrode for the pressure chamber CB. The drive signal VOUT is supplied from the drive signal selection circuit 200 to one electrode of the piezoelectric element 60, and the reference voltage signal VBS is supplied to the common electrode which is the other electrode of the piezoelectric element 60.

The protective substrate 641 is bonded to the surface on the +Z1 side of the flow path formation substrate 642. The protective substrate 641 forms a protective space 644 for protecting the piezoelectric element 60. In addition, the protective substrate 641 is provided with a through-hole 643 penetrating the protective substrate 641 along the Z1 direction. An end portion of a lead electrode 611 drawn out from the electrode of the piezoelectric element 60 is extended so as to be exposed inside the through-hole 643. The wiring member 388 is electrically coupled to the end portion of the lead electrode 611 exposed inside the through-hole 643.

In addition, a case 660 that defines a part of the manifold MN communicating with a plurality of the pressure chambers CB is fixed to the protective substrate 641 and the communication plate 630. The case 660 is bonded to the protective substrate 641 and also bonded to the communication plate 630. Specifically, the case 660 includes, on a surface on the −Z1 side, a recessed portion 665 in which the flow path formation substrate 642 and the protective substrate 641 are accommodated. The recessed portion 665 has an opening area wider than that of the flow path formation substrate 642 to which the protective substrate 641 is bonded. An opening surface of the recessed portion 665 on the −Z1 side is sealed by the communication plate 630 in a state where the flow path formation substrate 642 and the like are accommodated in the recessed portion 665. As a result, a supply communication path RB1 and a supply communication path RB2 are defined by the case 660, the flow path formation substrate 642, and the protective substrate 641 on an outer peripheral portion of the flow path formation substrate 642. Here, when it is not necessary to distinguish between the supply communication path RB1 and the supply communication path RB2, the supply communication paths RB1 and RB2 may be simply referred to as a supply communication path RB.

In addition, the compliance substrate 620 is provided on the surface of the communication plate 630 to which the supply communication path RA and the coupling communication path RX are open. The compliance substrate 620 seals openings of the supply communication path RA and the coupling communication path RX. Such a compliance substrate 620 includes a sealing film 621 and a fixed substrate 622. The sealing film 621 is formed of a flexible thin film or the like, and the fixed substrate 622 is formed of a hard material such as a metal, such as stainless steel.

The case 660 is provided with the introduction path 661 for supplying an ink to the manifold MN. In addition, the case 660 is provided with a coupling port 662 which is an opening communicating with the through-hole 643 of the protective substrate 641 and penetrating the case 660 along the Z1 direction, and into which the wiring member 388 is inserted.

The wiring member 388 is a flexible member for electrically coupling the discharge module 23 and the head substrate 35, and for example, an FPC can be used. In addition, an integrated circuit 201 is mounted on the wiring member 388 by chip on film (COF). At least a part of the drive signal selection circuit 200 described above is mounted on the integrated circuit 201.

In the discharge module 23 configured as described above, the drive signal VOUT output by the drive signal selection circuit 200 and the reference voltage signal VBS are supplied to the piezoelectric element 60 via the wiring member 388. The piezoelectric element 60 is driven by a change in the potential difference between the drive signal VOUT and the reference voltage signal VBS. As the piezoelectric element 60 is driven, the diaphragm 610 is displaced in a vertical direction, and an internal pressure of the pressure chamber CB changes. Because of the change in the internal pressure of the pressure chamber CB, the ink stored inside the pressure chamber CB is discharged from the corresponding nozzle N. Here, in the discharge module 23, the configuration including the nozzle N, the nozzle communication path RR, the pressure chamber CB, the piezoelectric element 60, and the diaphragm 610 corresponds to the discharge section 600 described above.

Returning to FIG. 8, the fixing plate 39 is located on the −Z1 side of the discharge module 23. The fixing plate 39 fixes the six discharge modules 23. Specifically, the fixing plate 39 includes six opening portions 391 penetrating the fixing plate 39 along the Z1 direction. The liquid ejection surface 623a of the discharge module 23 is exposed from each of the six opening portions 391. That is, the six discharge modules 23 are fixed to the fixing plate 39 such that the liquid ejection surface 623a is exposed from each of the corresponding opening portions 391.

The distribution flow path 37 is located on the +Z1 side of the discharge module 23. Four introduction portions 373 are provided on a surface on the +Z1 side of the distribution flow path 37. The four introduction portions 373 are flow path tubes that protrude from the surface on the +Z1 side of the distribution flow path 37 toward the +Z1 side along the Z1 direction, and communicate with a flow path hole (not illustrated) formed on a surface on the −Z1 side of the flow path structure 34. In addition, a flow path tube (not illustrated) that communicates with the four introduction portions 373 is located on a surface on the −Z1 side of the distribution flow path 37. The flow path tube (not illustrated) located on the surface on the −Z1 side of the distribution flow path 37 communicates with the introduction path 661 included in each of the six discharge modules 23. In addition, the distribution flow path 37 includes six opening portions 371 penetrating the distribution flow path 37 along the Z1 direction. The wiring member 388 included in each of the six discharge modules 23 is inserted into the six opening portions 371.

The head substrate 35 is located on the +Z1 side of the distribution flow path 37. A wiring member FC electrically coupled to the aggregate substrate 33 described below is attached to the head substrate 35. In addition, the head substrate 35 is formed with four opening portions 351 and notches 352 and 353. The wiring members 388 included in the discharge modules 23-2 to 23-5 are inserted into the four opening portions 351. The wiring member 388 of each of the discharge modules 23-2 to 23-5 inserted into the four opening portions 351 is electrically coupled to the head substrate 35 by solder or the like. In addition, the wiring member 388 included in the discharge module 23-1 passes through the notch 352, and the wiring member 388 included in the discharge module 23-6 passes through the notch 353. The wiring member 388 included in each of the discharge modules 23-1 and 23-6 that have passed through the notches 352 and 353 is electrically coupled to the head substrate 35 by solder or the like.

In addition, four notches 355 are formed at four corners of the head substrate 35. The introduction portions 373 pass through the four notches 355. The four introduction portions 373 that have passed through the notches 355 are coupled to the flow path structure 34 located on the +Z1 side of the head substrate 35.

The flow path structure 34 includes a flow path plate Su1 and a flow path plate Su2. The flow path plate Su1 and the flow path plate Su2 are laminated along the Z1 direction in a state where the flow path plate Su1 is located on the +Z1 side and the flow path plate Su2 is located on the −Z1 side, and are bonded to each other by an adhesive or the like.

The flow path structure 34 includes four introduction portions 341 protruding toward the +Z1 side along the Z1 direction on a surface on the +Z1 side. The four introduction portions 341 communicate with the flow path hole (not illustrated) formed on the surface on the −Z1 side of the flow path structure 34 via an ink flow path formed inside the flow path structure 34. The flow path hole (not illustrated) formed on the surface on the −Z1 side of the flow path structure 34 and the four introduction portions 373 communicate with each other. In addition, the flow path structure 34 is formed with a through-hole 343 penetrating the flow path structure 34 along the Z1 direction. The wiring member FC that is electrically coupled to the head substrate 35 is inserted into the through-hole 343. In addition, inside the flow path structure 34, in addition to the ink flow path through which the introduction portion 341 communicates with the flow path hole (not illustrated) formed on the surface on the −Z1 side, a filter or the like for capturing foreign matter contained in the ink flowing through the ink flow path may be provided.

The housing 31 is located so as to cover the periphery of the flow path structure 34, the head substrate 35, the distribution flow path 37, and the fixing plate 39, and supports the flow path structure 34, the head substrate 35, the distribution flow path 37, and the fixing plate 39. The housing 31 includes four opening portions 311, an aggregate substrate insertion portion 313, and a holding member 315.

The four introduction portions 341 included in the flow path structure 34 are inserted into the four opening portions 311. An ink is supplied from the liquid container 3 to the four introduction portions 341 inserted into the four opening portions 311 via a tube (not illustrated) or the like.

The holding member 315 holds the aggregate substrate 33 in a state where a part of the aggregate substrate 33 is inserted into the aggregate substrate insertion portion 313. The aggregate substrate 33 is provided with a coupling portion 330. Various signals such as the data signal DATA, the drive signals COMA, COMB, and COMC, the reference voltage signal VBS, and other power supply voltages output by the head drive module 10 are input to the coupling portion 330 via the wiring member 30. In addition, the wiring member FC included in the head substrate 35 is electrically coupled to the aggregate substrate 33. As a result, the aggregate substrate 33 and the head substrate 35 are electrically coupled to each other. The aggregate substrate 33 may be provided with a semiconductor device including the above-described restoration circuit 220. FIG. 8 illustrates a case where the aggregate substrate 33 has one coupling portion 330, but the present disclosure is not limited to this configuration. For example, when the head unit 5 includes a plurality of the wiring members 30, and various signals such as the data signal DATA, the drive signals COMA, COMB, and COMC, the reference voltage signal VBS, and other power supply voltages output by the head drive module 10 are input to the aggregate substrate 33 via the plurality of wiring members 30, the aggregate substrate 33 may include a plurality of the coupling portions 330 corresponding to the plurality of wiring members 30.

In the liquid discharge module 20 configured as described above, the ink stored in the liquid container 3 is supplied by the communication between the liquid container 3 and the introduction portion 341 via a tube or the like (not illustrated). The ink supplied to the liquid discharge module 20 is guided to a flow path hole (not illustrated) formed on the surface on the −Z1 side of the flow path structure 34 via the ink flow path formed inside the flow path structure 34, and then is supplied to the four introduction portions 373 included in the distribution flow path 37. The ink supplied to the distribution flow path 37 via the four introduction portions 373 is distributed correspondingly to each of the six discharge modules 23 in an ink flow path (not illustrated) formed inside the distribution flow path 37, and then supplied to the introduction path 661 included in the corresponding discharge module 23. The ink supplied to the discharge module 23 via the introduction path 661 is stored in the pressure chamber CB included in the discharge section 600.

In addition, the head drive module 10 and the liquid discharge module 20 are electrically coupled to each other by one or a plurality of wiring members 30. As a result, various signals including the drive signals COMA, COMB, and COMC, the reference voltage signal VBS, and the data signal DATA output by the head drive module 10 are supplied to the liquid discharge module 20. Various signals including the drive signals COMA, COMB, and COMC, the reference voltage signal VBS, and the data signal DATA input to the liquid discharge module 20 are propagated through the aggregate substrate 33 and the head substrate 35. At this time, the restoration circuit 220 generates the clock signals SCK1 to SCK6, the print data signals SI1 to SI6, and the latch signals LAT1 to LAT6 corresponding to the discharge modules 23-1 to 23-6, from the data signal DATA. The integrated circuit 201 including the drive signal selection circuit 200 provided in the wiring member 388 generates the drive signal VOUT corresponding to each of the n discharge sections 600, and supplies the drive signal VOUT to the piezoelectric element 60 included in the corresponding discharge section 600. As a result, the piezoelectric element 60 is driven, and the ink stored in the pressure chamber CB is discharged.

4. Structure of Head Drive Module

Figure 12:
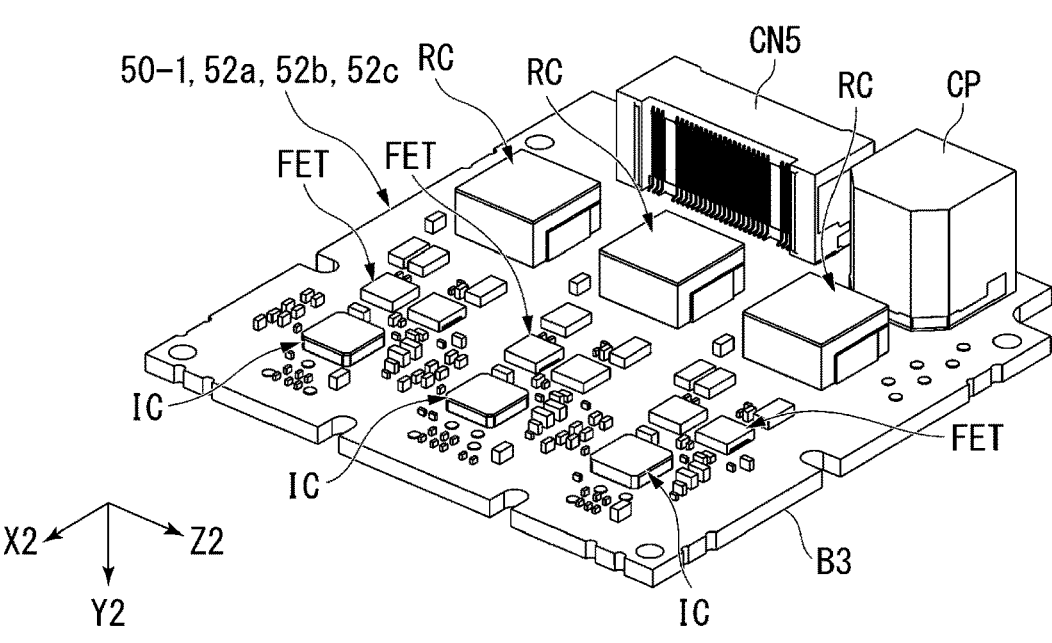
FIG. 12 is a diagram illustrating a mounting example of a drive signal output circuit on a third substrate included in a drive circuit section.
Figure 13:
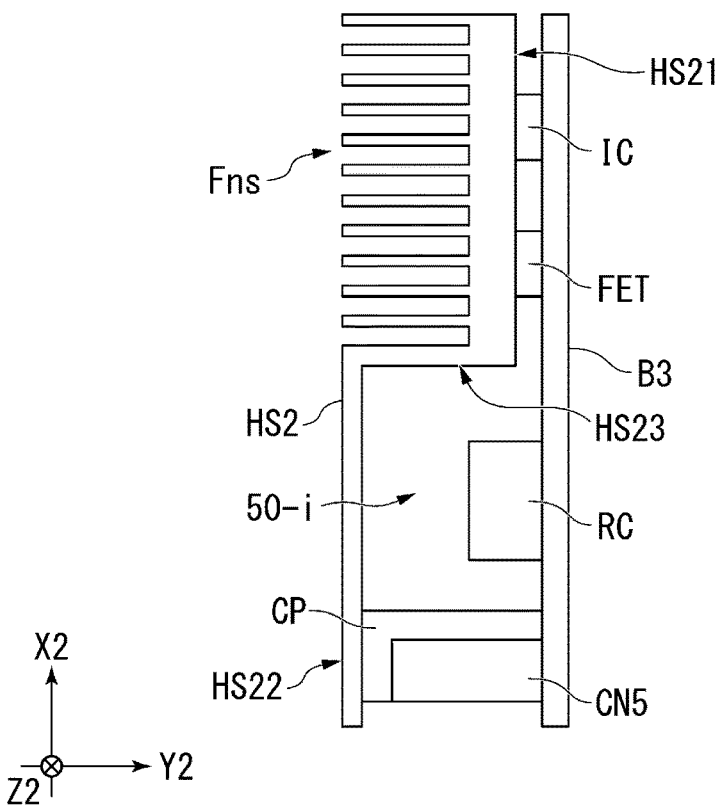
FIG. 13 is a diagram illustrating an example of a positional relationship between a heat sink, the drive signal output circuit, and the third substrate.

Next, a structure of the head drive module 10 will be described with reference to FIGS. 11 to 13. Here, in the following description, arrows indicating an X2 direction, a Y2 direction, and a Z2 direction which are independent of the above-described X1 direction, Y1 direction, and Z1 direction and are orthogonal to each other are illustrated. In addition, a starting point side of the arrow indicating the X2 direction may be referred to as a −X2 side, a tip end side thereof may be referred to as a +X2 side, a starting point side of the arrow indicating the Y2 direction may be referred to as a −Y2 side, a tip end side thereof may be referred to as a +Y2 side, a starting point side of the arrow indicating the Z2 direction may be referred to as a −Z2 side, and a tip end side thereof may be referred to as a +Z2 side. In addition, as an example, a case where the Z2 direction is a direction opposite to a gravity direction, that is, an upward direction will be described. In addition, as an example, a case where a direction opposite to the X2 direction is the transport direction will be described. In addition, as an example, a case where a direction parallel to the Y2 direction is the main scanning direction will be described. In addition, as an example, a case where m=6 will be described below. In the present embodiment, as an example, a case where the control circuit 100 and the conversion circuit 120 are included in the common FPGA will be described. Note that the conversion circuit 120 may have a configuration not included in the FPGA.

Figure 11:
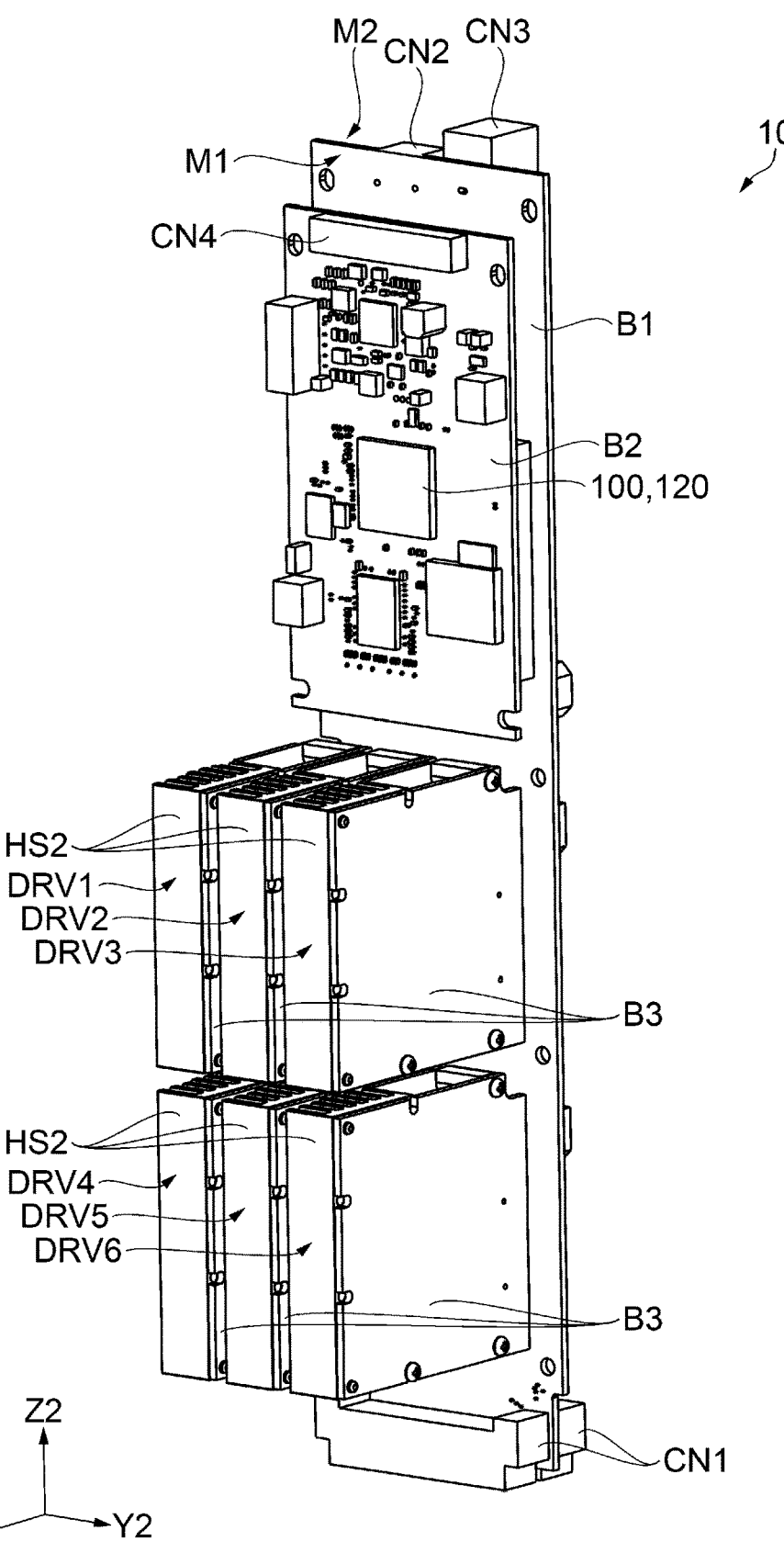
FIG. 11 is a perspective view illustrating an example of a structure of a head drive module.

FIG. 11 is a perspective view illustrating an example of the structure of the head drive module 10. As illustrated in FIG. 11, the head drive module 10 includes a first circuit substrate B1, a second circuit substrate B2, the control circuit 100, the conversion circuit 120, six drive circuit sections DRV1 to DRV6, a first connector CN1, a second connector CN2, a third connector CN3, and a fourth connector CN4. When it is not necessary to distinguish between the six drive circuit sections DRV1 to DRV6, the six drive circuit sections DRV1 to DRV6 may be simply referred to as a drive circuit section DRV.

The first circuit substrate B1 is a power supply board that supplies power to each member included in the head drive module 10. In addition, the first circuit substrate B1 is a substrate disposed on the +Z2 side with respect to the liquid discharge module 20 (not illustrated in FIG. 11) when the head drive module 10 is coupled to the liquid discharge module 20. In addition, the first circuit substrate B1 is a flat plate-shaped substrate in which longitudinal directions of a first surface M1 and a second surface M2, which are two surfaces of the first circuit substrate B1, extend toward the Z2 direction, and lateral directions of the first surface M1 and the second surface M2 extend toward the Y2 direction.

Here, in the present embodiment, the fact that a longitudinal direction or a lateral direction of a certain member extends in a certain direction may mean either that the certain member extends in the certain direction or that the certain member extends in a direction oblique to the certain direction. In the following, as an example, as illustrated in FIG. 11, a case where the first circuit substrate B1 is a flat plate-shaped substrate in which the longitudinal directions of the first surface M1 and the second surface M2 extend in the Z2 direction, and the lateral directions of the first surface M1 and the second surface M2 extend in the Y2 direction will be described.

The first circuit substrate B1 may be coupled to the liquid discharge module 20 via the wiring member 30, but may be coupled to the aggregate substrate 33 of the liquid discharge module 20 in a board to board (B-to-B) manner, not via the wiring member 30. Here, the B-to-B coupling means that two substrates are electrically coupled to each other by a pair of connectors mounted on the substrates not via an electric wire, a flexible wiring substrate, or the like. When the first circuit substrate B1 is B-to-B-coupled not via the wiring member 30, a wiring path through which the drive signals COMA, COMB, and COMC generated by the head drive module 10 propagate until being input to the selection circuit 230 is shortened, and the drive signals COMA, COMB, and COMC are less affected by the inductance of the wiring path. Accordingly, the accuracy of the drive signal VOUT output from the selection circuit 230 and applied to the piezoelectric element 60 is improved, and the discharge stability of the liquid discharge module 20 is improved.

The six drive circuit sections DRV, the second circuit substrate B2, and the like are mounted on the first surface M1 of the first circuit substrate B1. In addition, the first connector CN1 is provided at an end portion on the −Z2 side among end portions of the first surface M1 of the first circuit substrate B1. The second connector CN2 and the third connector CN3 are provided at an end portion on the +Z2 side among end portions of the second surface M2 of the first circuit substrate B1. As described above, the first circuit substrate B1 has the first connector CN1, the second connector CN2, and the third connector CN3.

The first connector CN1 is a connector to which a transmission cable through which the drive signals COMA, COMB, and COMC output from each of the drive circuit 52a, the drive circuit 52b, and the drive circuit 52c are transmitted is coupled. The liquid discharge module 20 or the wiring member 30 coupled to the liquid discharge module 20 is coupled to the first connector CN1. Therefore, the drive signals COMA, COMB, and COMC output from the drive circuit 52a, the drive circuit 52b, and the drive circuit 52c are output to the liquid discharge module 20 via the first connector CN1. In the examples illustrated in FIG. 11, the first connector CN1 is provided on each of the first surface M1 and the second surface M2, which are two surfaces of the first circuit substrate B1.

The second connector CN2 and the third connector CN3 are connectors to which a power supply cable for supplying power to the first circuit substrate B1, which is a power supply board, is coupled. The second connector CN2 and the third connector CN3 are provided on the second surface M2 of the first circuit substrate B1. The second connector CN2 and the third connector CN3 may be provided on the first surface M1 of the first circuit substrate B1.

An i-th drive circuit section DRVi among the six drive circuit sections DRV is provided on the first surface M1 of the first circuit substrate B1. In other words, the drive circuit section DRVi is coupled onto the first surface M1 of the first circuit substrate B1. The drive circuit section DRVi includes a drive signal output circuit 50-i. That is, the drive circuit section DRVi includes three drive circuits of the drive circuit 52a, the drive circuit 52b, and the drive circuit 52c (not illustrated in FIG. 11), and the reference voltage output circuit 53. Here, i is an integer from 1 to 6.

In addition, the drive circuit section DRVi includes a third circuit substrate B3 on which the drive signal output circuit 50-i is mounted, and a heat sink HS2.

Here, as illustrated in FIG. 11, the third circuit substrate B3 is B-to-B-coupled to the first circuit substrate B1 and stands upright with respect to the first circuit substrate B1. Therefore, all couplings between the third circuit substrate B3 and other substrates are via B-to-B coupling to the first circuit substrate B1. In addition, as illustrated in FIG. 12, the third circuit substrate B3 is a flat plate-shaped substrate, and the drive signal output circuit 50-i is mounted on the third circuit substrate B3. FIG. 12 is a diagram illustrating a mounting example of the drive signal output circuit 50-1 on the third circuit substrate B3 included in the drive circuit section DRV1. Since mounting examples of the drive signal output circuits 50-2 to 50-6 on the third circuit substrate B3 to a mounting example of the drive signal output circuit 50-6 on the third substrate B3 are the same as the mounting example of the drive signal output circuit 50-1 on the third circuit substrate B3, description thereof will be omitted. In the example illustrated in FIG. 12, on the third circuit substrate B3 of the drive circuit section DRV1, three integrated circuits IC, three electric field effect transistors FET, three coils RC, one electrolytic capacitor CP constituting the drive circuit 52a, the drive circuit 52b, and the drive circuit 52c as class D amplifier circuits are mounted. In this example, on the third circuit substrate B3, the three integrated circuits IC, the three electric field effect transistors FET, and the three coils RC are arranged in the X2 direction in the order of the three coils RC, the three electric field effect transistors FET, and the three integrated circuits IC. In addition, in this example, the three integrated circuits IC are arranged in the Z2 direction. In addition, in this example, the three electric field effect transistors FET are arranged in the Z2 direction. In addition, in this example, the three coils RC are arranged in the Z2 direction. In addition, in this example, the one electrolytic capacitor CP is located on the −X2 side with respect to the three coils RC. That is, in this example, the third circuit substrate B3 is mounted with the electrolytic capacitor CP on the first circuit substrate B1 side with respect to the drive circuit 52a, the drive circuit 52b, and the drive circuit 52c of the drive signal output circuit 50-1. The third circuit substrate B3 may be mounted with another type of capacitor instead of the electrolytic capacitor CP.

In addition, a fifth connector CN5 is provided at an end portion on the −X2 side among end portions of the third circuit substrate B3 of the drive circuit section DRV1. The fifth connector CN5 is coupled to a connector (not illustrated) provided on the first circuit substrate B1. As a result, the drive circuit section DRV1 is B-to-B-coupled to the first circuit substrate B1. As a result, the drive circuit section DRV1 is coupled onto the first circuit substrate B1 so as to extend in a direction intersecting the first circuit substrate B1. In the example illustrated in FIG. 11, the drive circuit section DRV1 is B-to-B-coupled to the first circuit substrate B1 so as to extend in the X2 direction which is a direction orthogonal to the first circuit substrate B1. In addition, the fifth connector CN5 is a connector for outputting, to the liquid discharge module 20, the drive signals COMA, COMB, and COMC output from each of the drive circuit 52a, the drive circuit 52b, and the drive circuit 52c included in the drive circuit section DRV1 via the first circuit substrate B1.

The heat sink HS2 is a heat sink for cooling the drive signal output circuit 50-i. The heat sink HS2 is provided on the third circuit substrate B3 so as to interpose the drive signal output circuit 50-i mounted on the third circuit substrate B3 together with the third circuit substrate B3. FIG. 13 is a diagram illustrating an example of a positional relationship between the heat sink HS2, the drive signal output circuit 50-i, and the third circuit substrate B3. Here, in the examples illustrated in FIGS. 11 and 13, an outer shape of the drive circuit section DRVi is a substantially rectangular shape. Such an outer shape of the drive circuit section DRVi is configured by the third circuit substrate B3 and the heat sink HS2 included in the drive circuit section DRVi. The heat sink HS2 provided in the drive signal output circuit 50-i includes a first flat plate member HS21, a second flat plate member HS22, a first coupling member HS23 that couples the first flat plate member HS21 and the second flat plate member HS22, and a plurality of fins Fns provided on the first flat plate member HS21. The first flat plate member HS21 is a flat plate-shaped member in contact with each of the three integrated circuits IC on the third circuit substrate B3 and the three electric field effect transistors FET on the third circuit substrate B3. In FIG. 13, for simplification of the drawing, the three integrated circuits IC on the third circuit substrate B3 are illustrated as one rectangular-shaped object. In addition, in FIG. 13, for simplification of the drawing, the three electric field effect transistors FET on the third circuit substrate B3 are illustrated as one rectangular-shaped object. The second flat plate member HS22 is a flat plate-shaped member parallel to the first flat plate member HS21, and is a member separated from the third circuit substrate B3 at a greater distance than the first flat plate member HS21. When the heat sink HS2 is viewed in the Y2 direction, an end portion on the +X2 side among end portions of the second flat plate member HS22 overlaps an end portion on the −X2 side among end portions of the first flat plate member HS21. The first coupling member HS23 is a flat plate-shaped member that couples these two end portions, and is a member that is parallel to a Y2-Z2 plane. Here, in a space between the second flat plate member HS22 and the third circuit substrate B3, the three coils RC, the electrolytic capacitor CP, and the like mounted on the third circuit substrate B3 are located. Each of the plurality of fins Fns is a flat plate-shaped fin parallel to the Y2-Z2 plane. Since the heat sink HS2 has such a configuration, the plurality of fins Fns do not substantially obstruct an airflow flowing in the Z2 direction. In addition, as illustrated in FIG. 13, since the heat sink HS2 is configured without a flat plate-shaped member parallel to an X2-Y2 plane, the airflow flowing in the Z2 direction is substantially unobstructed by the heat sink HS2. As a result, the airflow flowing in the Z2 direction can efficiently dissipate heat from the drive circuit section DRVi.

As illustrated in FIG. 11, the second circuit substrate B2 is a flat plate-shaped substrate, and is an interface board on which the control circuit 100 and the conversion circuit 120 are mounted. More specifically, the second circuit substrate B2 is mounted on the first surface M1 of the first circuit substrate B1 on the +Z2 side with respect to the six drive circuit sections DRV. In addition, in the example illustrated in FIG. 11, the second circuit substrate B2 is B-to-B-coupled to the first circuit substrate B1. The second circuit substrate B2 may be coupled to the first circuit substrate B1 by a coupling method different from the B-to-B coupling. In addition, the fourth connector CN4 is provided at an end portion on the +Z2 side among end portions of the second circuit substrate B2. Therefore, in this example, in the head drive module 10, the first connector CN1, the six drive circuit sections DRV, the conversion circuit 120, and the fourth connector CN4 are arranged in the Z2 direction in the order of the first connector CN1, the six drive circuit sections DRV, the conversion circuit 120, and the fourth connector CN4.

The fourth connector CN4 is a connector to which a transmission cable for transmitting a signal such as the image information signal IP input to the control circuit 100 is coupled. Therefore, the image information signal IP is input to the control circuit 100 via the fourth connector CN4. The fourth connector CN4 is also a connector for propagating a control signal input to the conversion circuit 120.

Therefore, a control signal is input to the conversion circuit 120 via the fourth connector CN4. Here, as described above, the second circuit substrate B2 is B-to-B-coupled to the first circuit substrate B1. Therefore, the conversion circuit 120 operates by the power supplied from the first circuit substrate B1 to the second circuit substrate B2. On the other hand, the control signal is input to the second circuit substrate B2 via the fourth connector CN4, not via the first circuit substrate B1. That is, the conversion circuit 120 receives the control signal via the fourth connector CN4, not via the first circuit substrate B1. The fourth connector CN4 is, for example, a right-angle connector, but may be another type of connector instead.

5. Structure of Cooling Unit

Next, a structure of the cooling unit 6 that cools the head drive module 10 will be described. Hereinafter, in order to simplify the description, it is assumed that the liquid discharge apparatus 1 includes three head units 5 that discharge inks of the same color. That is, the liquid discharge apparatus 1 includes three head drive modules 10. In this case, these three head units 5 constitute a line head. Note that the number of the head units 5, that is, the number of the head drive modules 10 is not limited to three.

Figure 14:
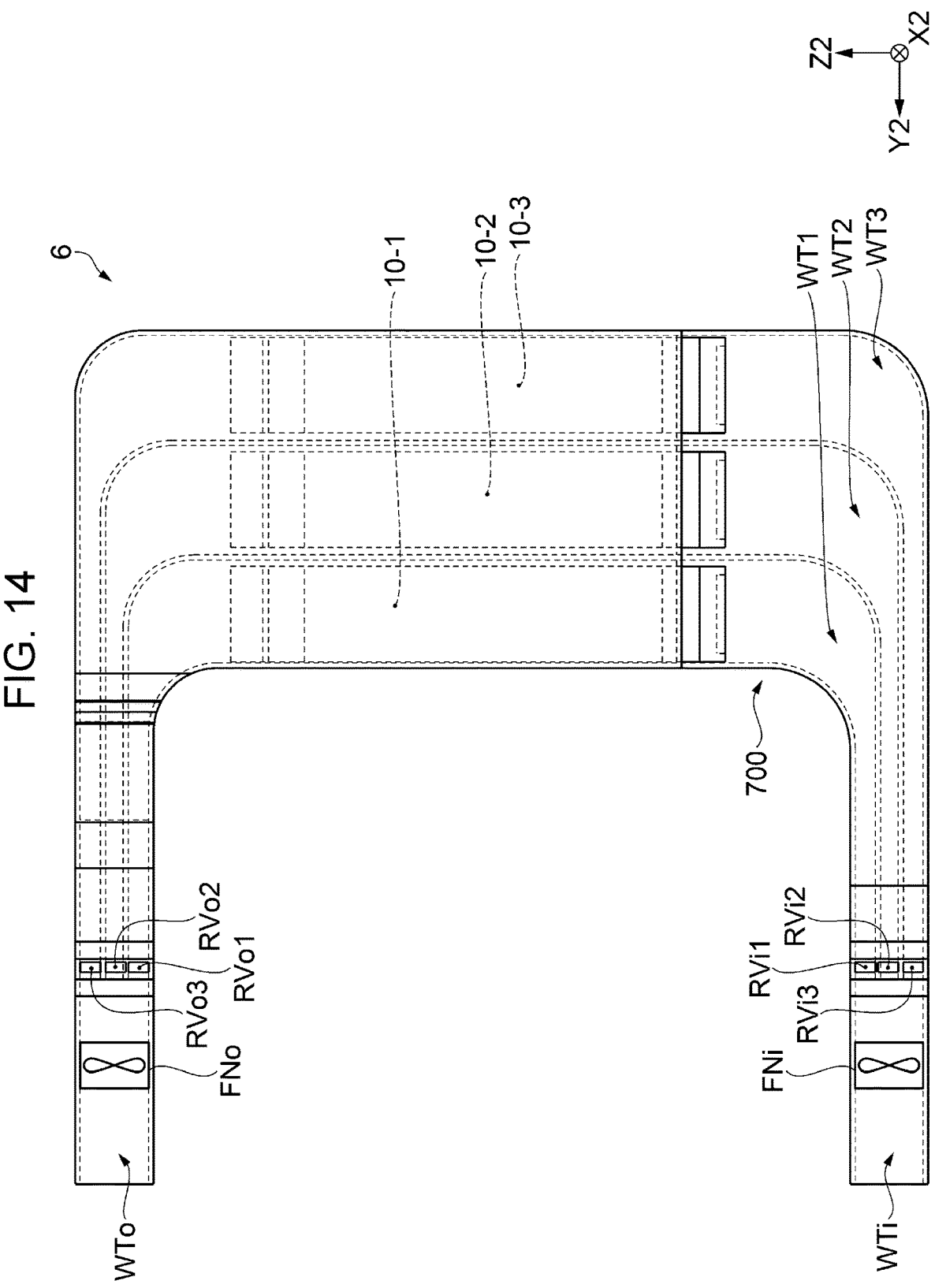
FIG. 14 is a diagram illustrating an example of a structure of a cooling unit.

FIG. 14 is a diagram illustrating an example of the structure of the cooling unit 6 and is a front view of the cooling unit 6 as viewed from the −X2 side. As illustrated in FIG. 14, the cooling unit 6 has the duct 700, the intake fan FNi, the exhaust fan FNo, three intake side adjustment sections RVi1, RVi2, and RVi3, and three exhaust side adjustment sections RVo1, RVo2, and RVo3.

The duct 700 includes a common intake wind tunnel WTi, a common exhaust wind tunnel WTo, a first wind tunnel WT1, a second wind tunnel WT2, and a third wind tunnel WT3, and serves as a path of air for cooling. In other words, the common intake wind tunnel WTi, the common exhaust wind tunnel WTo, the first wind tunnel WT1, the second wind tunnel WT2, and the third wind tunnel WT3 constitute the duct 700, and the direction in which internal air can move is limited to a predetermined direction. The first wind tunnel WT1, the second wind tunnel WT2, and the third wind tunnel WT3 are disposed between the common intake wind tunnel WTi and the common exhaust wind tunnel WTo, and each of the first wind tunnel WT1, the second wind tunnel WT2, and the third wind tunnel WT3 communicates with the common intake wind tunnel WTi and the common exhaust wind tunnel WTo.

The common intake wind tunnel WTi is a tubular wind tunnel extending in the Y2 direction. The common intake wind tunnel WTi corresponds to the intake port of the duct 700 and sucks air outside the housing HS from an opening on the +Y2 side. An opening of the common intake wind tunnel WTi on the −Y2 side is coupled to an opening of each of the first wind tunnel WT1, the second wind tunnel WT2, and the third wind tunnel WT3. The common intake wind tunnel WTi may protrude to the outside of the housing HS (see FIG. 15).

The first wind tunnel WT1, the second wind tunnel WT2, and the third wind tunnel WT3 are tubular wind tunnels bent in a U shape. Specifically, the first wind tunnel WT1, the second wind tunnel WT2, and the third wind tunnel WT3 extend in the Z2 direction at a center portion of the path, and end portions thereof on the −Z2 side and end portions on the +Z2 side are bent on the +Y2 side in the Y2 direction. The opening of the common intake wind tunnel WTi on the −Y2 side is coupled to openings of the first wind tunnel WT1, the second wind tunnel WT2, and the third wind tunnel WT3 on the −Z2 side.

The first wind tunnel WT1, the second wind tunnel WT2, and the third wind tunnel WT3 are arranged in the Y2 direction at the center portion of the path. Specifically, the first wind tunnel WT1, the second wind tunnel WT2, and the third wind tunnel WT3 are arranged in order of the first wind tunnel WT1, the second wind tunnel WT2, and the third wind tunnel WT3 from the +Y2 side to the −Y2 side. In other words, the second wind tunnel WT2 is adjacent to the U-shaped first wind tunnel WT1 along an outer periphery, and the third wind tunnel WT3 is adjacent to the U-shaped second wind tunnel WT2 along an outer periphery. The first wind tunnel WT1 and the second wind tunnel WT2 may be partitioned by a plate-shaped member or may be disposed apart from each other. Similarly, the second wind tunnel WT2 and the third wind tunnel WT3 may be partitioned by a plate-shaped member or may be disposed apart from each other.

The common exhaust wind tunnel WTo is a tubular wind tunnel extending in the Y2 direction, and an opening of the common exhaust wind tunnel WTo on the −Y2 side is coupled to an opening of each of the first wind tunnel WT1, the second wind tunnel WT2, and the third wind tunnel WT3 on the +Z2 side. The common exhaust wind tunnel WTo corresponds to the exhaust port of the duct 700 and discharges air to the outside of the housing HS from an opening on the +Y2 side. The common exhaust wind tunnel WTi may protrude to the outside of the housing HS (see FIG. 15).

The intake fan FNi is disposed in the common intake wind tunnel WTi, and sucks air outside the housing HS the air from an opening of the common intake wind tunnel WTi on the +Y2 side to blow the air into the duct 700. In addition, the exhaust fan FNo is disposed in the common exhaust wind tunnel WTo, and discharges the air in the duct 700 to the outside of the housing HS from an opening of the common exhaust wind tunnel WTo on the +Y2 side. That is, the rotation of the intake fan FNi and the exhaust fan FNo generates an airflow in the duct 700. The air sucked into the common intake wind tunnel WTi from the outside of the housing HS is distributed into a path passing through the first wind tunnel WT1, a path passing through the second wind tunnel WT2, and a path passing through the third wind tunnel WT3. Then, the air passed through the first wind tunnel WT1, the second wind tunnel WT2, and the third wind tunnel WT3 converges in the common exhaust wind tunnel WTo and is discharged to the outside of the housing HS. It is desirable that the duct 700 is configured such that the air does not come in and out except for the opening of the common intake wind tunnel WTi on the +Y2 side, which is the intake port, and the opening of the common exhaust wind tunnel WTo on the +Y2 side, which is the exhaust port. With the above-described configuration, the movement direction of the air in the duct 700 can be limited to a predetermined direction, and the air in the housing HS can be prevented from flowing into the duct 700. Therefore, as the ink is discharged from the discharge section 600, even when a part of the discharged ink floats in the housing HS as ink mist, it is possible to reduce a risk that the ink mist enters the duct 700.

The intake side adjustment section RVi1 is disposed in the vicinity of the opening of the first wind tunnel WT1 on the −Z2 side, the intake side adjustment section RVi2 is disposed in the vicinity of the opening of the second wind tunnel WT2 on the −Z2 side, and the intake side adjustment section RVi3 is disposed in the vicinity of the opening of the third wind tunnel WT3 on the −Z2 side. The intake side adjustment sections RVi1, RVi2, and RVi3 are adjustment valves, and are capable of adjusting opening areas of the openings of the first wind tunnel WT1, the second wind tunnel WT2, and the third wind tunnel WT3 on the −Z2 side, respectively. Therefore, the amount of the air sucked into the first wind tunnel WT1, the second wind tunnel WT2, and the third wind tunnel WT3 from the common intake wind tunnel WTi can be adjusted by the intake side adjustment sections RVi1, RVi2, and RVi3. That is, the air sucked into the common intake wind tunnel WTi is distributed into the first wind tunnel WT1, the second wind tunnel WT2, and the third wind tunnel WT3 in accordance with the adjustment states of the intake side adjustment sections RVi1, RVi2, and RVi3.

The exhaust side adjustment section RVo1 is disposed in the vicinity of the opening of the first wind tunnel WT1 on the +Z2 side, the exhaust side adjustment section RVo2 is disposed in the vicinity of the opening of the second wind tunnel WT2 on the +Z2 side, and the exhaust side adjustment section RVo3 is disposed in the vicinity of an opening of the third wind tunnel WT3 on the +Z2 side. The exhaust side adjustment sections RVo1, RVo2, and RVo3 are adjustment valves, and are capable of adjusting opening areas of the openings of the first wind tunnel WT1, the second wind tunnel WT2 on the +Z2 side, and the third wind tunnel WT3, respectively. Therefore, the amount of the air discharged from the first wind tunnel WT1, the second wind tunnel WT2, and the third wind tunnel WT3 to the common exhaust wind tunnel WTo can be adjusted by the exhaust side adjustment sections RVo1, RVo2, and RVo3. That is, the air of an amount corresponding to the adjustment states of the exhaust side adjustment sections RVo1, RVo2, and RVo3 is discharged from the first wind tunnel WT1, the second wind tunnel WT2, and the third wind tunnel WT3 to the common exhaust wind tunnel WTo.

The three head drive modules 10 are disposed inside the first wind tunnel WT1, the second wind tunnel WT2, and the third wind tunnel WT3, respectively. Specifically, the three head drive modules 10 are disposed in the Z2 direction at the center portions of the paths in the first wind tunnel WT1, the second wind tunnel WT2, and the third wind tunnel WT3, respectively. In the following description, the head drive module 10 disposed in the first wind tunnel WT1 may be referred to as a head drive module 10-1, the head drive module 10 disposed in the second wind tunnel WT2 may be referred to as a head drive module 10-2, and the head drive module 10 disposed in the third wind tunnel WT3 may be referred to as a head drive module 10-3. That is, the head drive module 10-1 is cooled by an airflow passing through the first wind tunnel WT1, the head drive module 10-2 is cooled by an airflow passing through the second wind tunnel WT2, and the head drive module 10-3 is cooled by an airflow passing through the third wind tunnel WT3.

The head drive module 10 may be configured to partially protrude from the first wind tunnel WT1, the second wind tunnel WT2, and the third wind tunnel WT3. In addition, a part of the head drive module 10, such as the first circuit substrate B1, may constitute a part of the first wind tunnel WT1, the second wind tunnel WT2, and the third wind tunnel WT3. Note that, in the head drive module 10, a portion that particularly requires cooling or a portion that is likely to be short-circuited due to the adhesion of ink mist, such as the drive circuit section DRV, is disposed inside the first wind tunnel WT1, the second wind tunnel WT2, and the third wind tunnel WT3.

The cooling unit 6 having the above-described configuration can generate an airflow in the duct 700 by driving the intake fan FNi, the exhaust fan FNo, or both of the intake fan FNi and the exhaust fan FNo, and can cool the head drive module 10. When both the intake fan FNi and the exhaust fan FNo are driven, it is preferable that a blowing amount of the intake fan FNi is larger than a blowing amount of the exhaust fan FNo. As a result, it is possible to make pressure inside the duct 700 positive, thereby further reducing the risk that the ink mist flows into the duct 700.

Here, a path of the airflow passing through the first wind tunnel WT1 is referred to as a first path, a path of the airflow passing through the second wind tunnel WT2 is referred to as a second path, and a path of the airflow passing through the third wind tunnel WT3 is referred to as a third path. That is, the first wind tunnel WT1 guides the airflow to the first path, the second wind tunnel WT2 guides the airflow to the second path, and the third wind tunnel WT3 guides the airflow to the third path. The first path, the second path, and the third path are different paths. The cooling unit 6 can adjust the amount of the air passing through the first path, that is, the amount of the blowing amount to the first wind tunnel WT1 by adjusting any one or both of the intake side adjustment section RVi1 and the exhaust side adjustment section RVo1. Similarly, the cooling unit 6 can adjust the amount of the air passing through the second path, that is, the amount of the blowing amount to the second wind tunnel WT2 by adjusting any one or both of the intake side adjustment section RVi2 and the exhaust side adjustment section RVo2. Then, the cooling unit 6 can adjust the amount of the air passing through the third path, that is, the amount of the blowing amount to the third wind tunnel WT3 by adjusting any one or both of the intake side adjustment section RVi3 and the exhaust side adjustment section RVo3. With such a configuration, the cooling unit 6 can adjust a cooling rate of each of the head drive module 10-1, the head drive module 10-2, and the head drive module 10-3.

The intake side adjustment sections RVi1, RVi2, and RVi3 and the exhaust side adjustment sections RVo1, RVo2, and RVo3 may be manually adjusted or may be adjusted based on the cooling control signal output from the control unit 2. In addition, a part of the intake side adjustment sections RVi1, RVi2, and RVi3 and the exhaust side adjustment sections RVo1, RVo2, and RVo3 may be manually adjusted, and the other part may be adjusted based on the cooling control signal. When at least a part of the intake side adjustment sections RVi1, RVi2, and RVi3, and the exhaust side adjustment sections RVo1, RVo2, and RVo3 is configured to be adjusted by the cooling control signal, that is, under the control of the control unit 2, these are adjusted based on, for example, a heat generation amount of the head drive module 10. In this case, the heat generation amount of each head drive module 10 can be detected by attaching a temperature sensor to each head drive module 10. Then, the control unit 2 adjusts at least a part of the intake side adjustment sections RVi1, RVi2, and RVi3 and the exhaust side adjustment sections RVo1, RVo2, and RVo3 based on the detected heat generation amount. Specifically, the control unit 2 outputs the cooling control signal to the cooling unit 6 such that the blowing amount to the wind tunnel in which the head drive module 10 having a large heat generation amount is disposed is increased. For example, when the heat generation amount of the head drive module 10-1 is larger than the heat generation amount of the head drive module 10-2, the control unit 2 controls the intake side adjustment sections RVi1 and RVi2 and the exhaust side adjustment sections RVo1 and RVo2 such that the blowing amount to the first wind tunnel WT1 is larger than the blowing amount to the second wind tunnel WT2. Alternatively, since the heat generation amount of the head drive module 10 changes depending on the aspect of the image formed on the medium P, the control unit 2 may adjust at least a part of the intake side adjustment sections RVi1, RVi2, and RVi3 and the exhaust side adjustment sections RVo1, RVo2, and RVo3 based on the image information signal IP.

Figure 15:
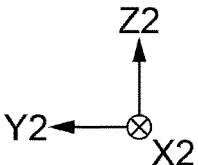
FIG. 15 is a front view illustrating a head unit and the cooling unit.
Figure 16:
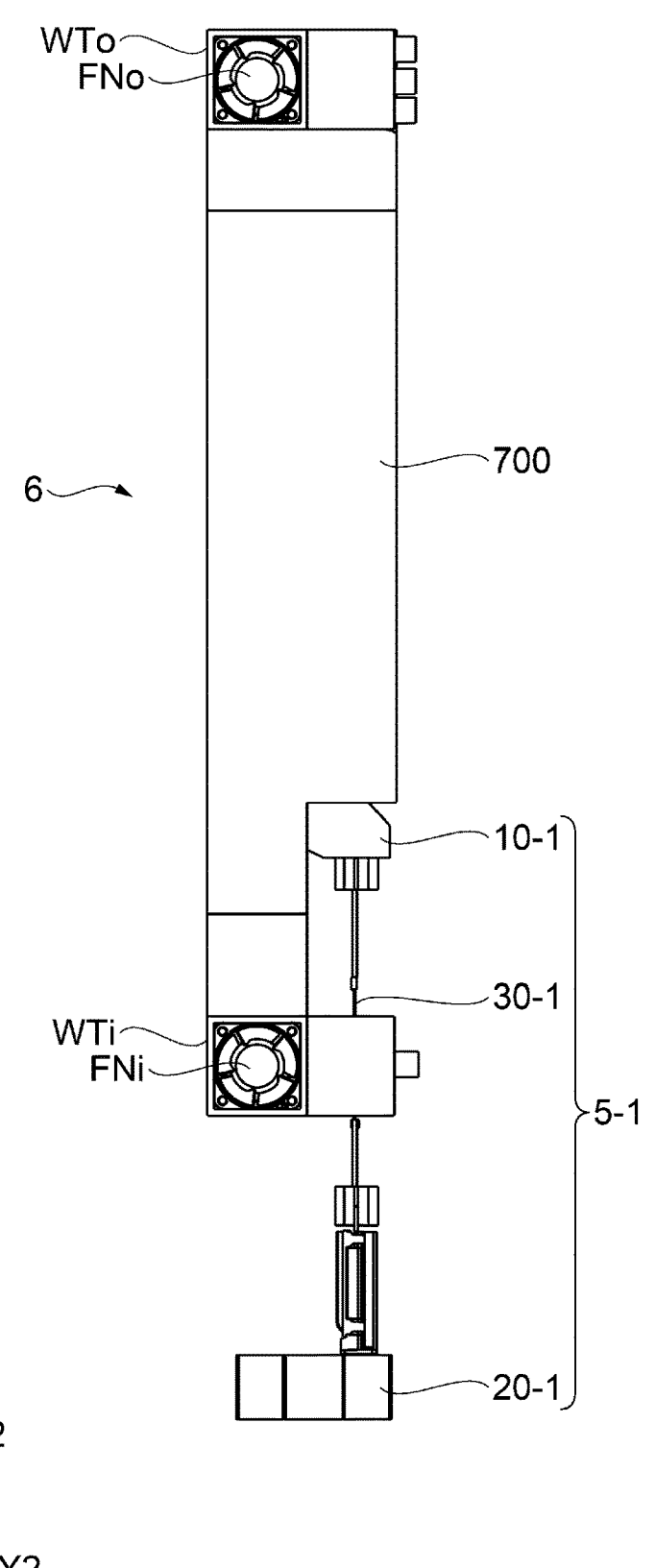
FIG. 16 is a side view illustrating the head unit and the cooling unit.
Figure 17:
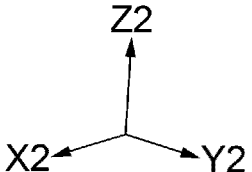
FIG. 17 is a perspective view illustrating the head unit and the cooling unit.

FIGS. 15 to 17 are diagrams illustrating the head unit 5 and the cooling unit 6, FIG. 15 is a front view as viewed from the −X2 side, FIG. 16 is a side view as viewed from the +Y2 side, and FIG. 17 is a perspective view as viewed from a substantially +X2 side. In FIG. 15, an outer shape of the housing HS is indicated by a two-dot chain line.

The liquid discharge module 20 and the wiring member 30 coupled to the head drive module 10-1 are referred to as a liquid discharge module 20-1 and a wiring member 30-1, respectively, and the head unit 5 including the head drive module 10-1, the liquid discharge module 20-1, and the wiring member 30-1 is referred to as a head unit 5-1. In addition, the liquid discharge module 20 and the wiring member 30 coupled to the head drive module 10-2 are referred to as a liquid discharge module 20-2 and a wiring member 30-2, respectively, and the head unit 5 including the head drive module 10-2, the liquid discharge module 20-2, and the wiring member 30-2 is referred to as a head unit 5-2. In addition, the liquid discharge module 20 and the wiring member 30 coupled to the head drive module 10-3 are referred to as a liquid discharge module 20-3 and a wiring member 30-3, respectively, and the head unit 5 including the head drive module 10-3, the liquid discharge module 20-3, and the wiring member 30-3 is referred to as a head unit 5-3.

As illustrated in FIG. 15, the cooling unit 6 is attached to the head units 5-1, 5-2, and 5-3 inside the housing HS. Both the opening of the common intake wind tunnel WTi on the +Y2 side that constitutes the duct 700 and the opening of the common exhaust wind tunnel WTo on the +Y2 side that constitutes the duct 700 are exposed from a surface of the housing HS on the +Y side. That is, the duct 700 communicates with the outside of the housing HS via the common intake wind tunnel WTi and the common exhaust wind tunnel WTo.

As illustrated in FIGS. 15 to 17, end portions of the head drive modules 10-1, 10-2, and 10-3 on the −Z2 side disposed inside the duct 700 are exposed to the outside of the duct 700, that is, to the outside of the first wind tunnel WT1, the second wind tunnel WT2, and the third wind tunnel WT3, on the −X2 side of the duct 700. Then, the liquid discharge module 20-1 is disposed outside the first wind tunnel WT1 and is coupled to the head drive module 10-1 via the wiring member 30-1. Similarly, the liquid discharge module 20-2 is disposed outside the second wind tunnel WT2 and is coupled to the head drive module 10-2 via the wiring member 30-2. In addition, the liquid discharge module 20-3 is disposed outside the third wind tunnel WT3 and is coupled to the head drive module 10-3 via the wiring member 30-3. In this way, the head drive modules 10-1, 10-2, and 10-3 are disposed inside the duct 700, while the liquid discharge modules 20-1, 20-2, and 20-3 are disposed outside the duct 700. That is, the head drive module 10 and the liquid discharge module 20 are separated by the duct 700. Therefore, the risk that the ink mist generated from the liquid discharge module 20 adheres to the head drive module 10 and causes a short circuit in the head drive module 10 is reduced. Further, the liquid discharge module 20 is disposed inside the housing HS, while the air outside the housing HS is sucked into the duct 700. Therefore, the risk that the ink mist is sucked into the duct 700 is further reduced. In addition, since the head drive module 10 and the liquid discharge module 20 are separated by the duct 700, the ink discharged from the liquid discharge module 20 is prevented from being exposed to the airflow for cooling. Therefore, it is possible to improve the accuracy of the landing position of the ink on the medium P, that is, the discharge position. Further, since the air in the duct 700 is discharged to the outside of the housing HS, the ink discharged from the liquid discharge module 20 is further prevented from being exposed to the airflow for cooling.

6. Modification Example

The embodiment of the present disclosure is described above in detail with reference to the drawings. However, the specific configuration is not limited to this embodiment, and may be changed, replaced, deleted, or the like without departing from the gist of the present disclosure. For example, the following changes can be made.

Figure 18:
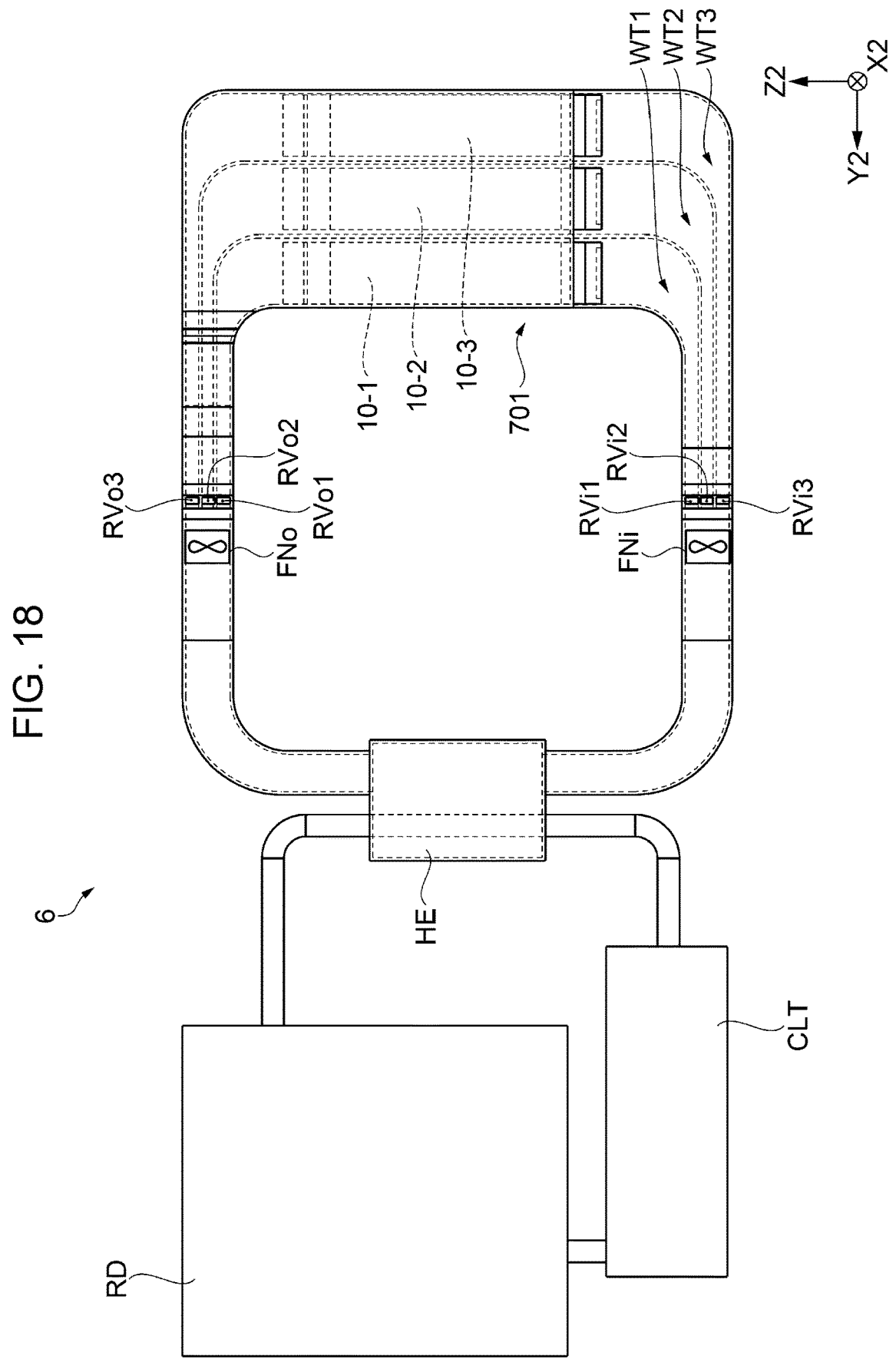
FIG. 18 is a diagram illustrating an example of a structure of a cooling unit according to a modification example.

In the above-described embodiment, the configuration in which the cooling unit 6 sucks the air outside the housing HS to cool the head drive module 10 is described, but the present disclosure is not limited to this configuration. For example, the cooling unit 6 may have a configuration in which a duct 701, which is a closed circuit, is provided instead of the duct 700 that communicates with the outside of the housing HS. As illustrated in FIG. 18, the duct 701 includes the first wind tunnel WT1, the second wind tunnel WT2, and the third wind tunnel WT3, and the head drive modules 10-1, 10-2, and 10-3 disposed in the wind tunnels are cooled by air circulating in the duct 701. In this configuration, the cooling unit 6 further includes, for example, a heat exchange section HE, a coolant tank CLT, and a radiator RD. Then, the air in the duct 701 whose temperature has increased by cooling the head drive module 10 is cooled by being heat-exchanged with a coolant supplied from the coolant tank CLT in the heat exchange section HE. The coolant after the heat exchange is cooled by the radiator RD and then returned to the coolant tank CLT. With this configuration, since the outside air is not sucked into the duct 701, the risk that the ink mist flows into the duct 701 can be further reduced.

In the above-described embodiment, the airflow is generated in the first wind tunnel WT1, the second wind tunnel WT2, and the third wind tunnel WT3 by one set of the intake fan FNi and the exhaust fan FNo, but the present disclosure is not limited to this configuration. For example, a configuration may be adopted in which any one or both of the intake fan FNi and the exhaust fan FNo are individually disposed in each of the first wind tunnel WT1, the second wind tunnel WT2, and the third wind tunnel WT3. Further, when the rotational speed of each intake fan FNi and each exhaust fan FNo, that is, the blowing amount can be changed by the control of the control unit 2, it is not necessary to provide an adjustment valve for each wind tunnel. In this case, the intake fan FNi and the exhaust fan FNo correspond to the adjustment sections.

In the above-described embodiment, an example is described in which the plurality of head units 5 that discharge the inks of the same color are arranged in one row in the Y2 direction as the line head, but when the liquid discharge apparatus 1 is configured to discharge the inks of a plurality of colors, the line heads for each color may be arranged in the X2 direction. In this case, the plurality of head units 5 are disposed in a matrix shape as viewed in the Z2 direction. In addition, in such a configuration, the head drive modules 10 of all the head units 5 may be cooled by the common cooling unit 6. That is, all the head drive modules 10 may be disposed in the common duct 700. Alternatively, the liquid discharge apparatus 1 may include the cooling unit 6 for each color, and a plurality of the cooling units 6 may be arranged in the X2 direction.

The items described above may be combined in any way.

7. Action and Effect

As described above, the liquid discharge apparatus according to the embodiment includes: a first drive circuit generating a first drive signal; a second drive circuit generating a second drive signal; a first discharge section discharging a liquid onto a medium based on the first drive signal; a second discharge section discharging a liquid onto the medium based on the second drive signal; a blowing section generating an airflow; a first wind tunnel guiding the airflow to a first path; and a second wind tunnel guiding the airflow to a second path different from the first path, in which the first drive circuit is disposed inside the first wind tunnel, the second drive circuit is disposed inside the second wind tunnel, and the first discharge section and the second discharge section are disposed outside the first wind tunnel and the second wind tunnel.

With this configuration, the first discharge section and the second discharge section that can cause the ink mist and the first drive circuit and the second drive circuit in which a short circuit can occur due to the ink mist can be separated into separate spaces by the first wind tunnel and the second wind tunnel, thereby reducing a possibility of generating a short circuit in the first drive circuit and the second drive circuit. Further, since the first drive circuit and the second drive circuit are disposed in separate wind tunnels, even when the ink mist enters one wind tunnel, it is possible to reduce a possibility that a short circuit occurs in the drive circuit disposed in the other wind tunnel. In addition, since the cooling is performed by air cooling, even when the first drive circuit and the second drive circuit have electronic components protruding from the substrate, such as coils and capacitors, these electronic components can be efficiently cooled.

In the example described above, the liquid discharge apparatus 1 is an example of the liquid discharge apparatus. In addition, in the example described above, the drive circuit section DRV included in the head drive module 10-1 is an example of the first drive circuit. In addition, in the example described above, the drive signals COMA, COMB, and COMC output from the drive circuit section DRV of the head drive module 10-1 are examples of the first drive signal. In addition, in the example described above, the drive circuit section DRV included in the head drive module 10-2 is an example of the second drive circuit. In addition, in the example described above, the drive signals COMA, COMB, and COMC output from the drive circuit section DRV of the head drive module 10-2 are examples of the second drive signal. In addition, in the example described above, the discharge section 600 included in the liquid discharge module 20-1 is an example of the first discharge section. In addition, in the example described above, the discharge section 600 included in the liquid discharge module 20-2 is an example of the second discharge section. In addition, in the example described above, the intake fan FNi and the exhaust fan FNo are examples of the blowing section. In addition, in the example described above, the first wind tunnel WT1 is an example of the first wind tunnel. In addition, in the example described above, the second wind tunnel WT2 is an example of the second wind tunnel.

In addition, the liquid discharge apparatus according to the embodiment further includes an adjustment section that adjusts the blowing amount to the first wind tunnel and the blowing amount to the second wind tunnel.

With this configuration, since the blowing amount to the first wind tunnel and the blowing amount to the second wind tunnel can be adjusted according to the heat generation amount of the first drive circuit and the second drive circuit, the first drive circuit and the second drive circuit can be efficiently cooled. In the example described above, at least one of the intake side adjustment sections RVi1 and RVi2 and the exhaust side adjustment sections RVo1 and RVo2 is an example of the adjustment section.

In addition, the liquid discharge apparatus according to the embodiment further includes a control section that controls the adjustment section such that, when the heat generation amount of the first drive circuit is larger than the heat generation amount of the second drive circuit, the blowing amount to the first wind tunnel is larger than the blowing amount to the second wind tunnel.

With this configuration, the control section increases the blowing amount to the wind tunnel in which the drive circuit having a large heat generation amount is disposed, so that the first drive circuit and the second drive circuit can be efficiently cooled. In the example described above, the control unit 2 is an example of the control section.

In addition, the liquid discharge apparatus according to the embodiment further includes a housing that encompasses the first drive circuit, the second drive circuit, the first discharge section, and the second discharge section, and the first wind tunnel and the second wind tunnel constitute a duct that is disposed inside the housing, and the duct includes an intake port that sucks air from the outside of the housing.

With this configuration, since the air outside the housing encompassing the first discharge section and the second discharge section is sucked into the duct, it is possible to reduce the influence of the ink mist received by the first drive circuit and the second drive circuit. In the example described above, the housing HS is an example of the housing. In addition, in the example described above, the duct 700 is an example of the duct. In addition, in the example described above, the common intake wind tunnel WTi is an example of the intake port.

In addition, in the liquid discharge apparatus according to the embodiment, the duct further includes an exhaust port that discharges air to the outside of the housing.

With this configuration, since the air is discharged to the outside of the housing encompassing the first discharge section and the second discharge section, it is possible to reduce the influence of the exhaust from the duct on the liquid discharged from the first discharge section and the second discharge section, and it is possible to improve the accuracy of the discharge position of the liquid on the medium P. In the example described above, the common exhaust wind tunnel WTo is an example of the exhaust port.

In addition, in the liquid discharge apparatus according to the embodiment, the blowing section includes a first blowing section that sucks air from the intake port and a second blowing section that discharges air from the exhaust port, and a blowing amount of the first blowing section is larger than a blowing amount of the second blowing section.

With this configuration, since the inside of the duct is made to be positive, a possibility that the ink mist enters the duct is reduced. Therefore, it is possible to reduce the influence of the ink mist received by the first drive circuit and the second drive circuit. In the example described above, the intake fan FNi is an example of the first blowing section. In addition, in the example described above, the exhaust fan FNo is an example of the second blowing section.

In addition, the liquid discharge apparatus according to the modification example further includes a heat exchange section that performs heat exchange, and the first wind tunnel and the second wind tunnel constitute a duct, the duct is a closed circuit in which air circulates, and the air in the duct is cooled by the heat exchange section.

With this configuration, since the duct is a closed circuit, the risk that the ink mist flows into the duct can be further reduced. In the example described above, the heat exchange section HE is an example of the heat exchange section. In addition, in the example described above, the duct 701 is an example of the duct.

In addition, in the liquid discharge apparatus according to embodiment, the first drive circuit is included in a first module including a first substrate, the first discharge section is included in a second module including a second substrate, and the first substrate and the second substrate are B-to-B coupled.

With this configuration, since the first substrate of the first module including the first drive circuit and the second substrate of the second module including the first discharge section are B-to-B-coupled, a propagation path of the first drive signal is shortened, and it is possible to reduce a risk of disturbance of the first drive signal. In the example described above, the head drive module 10-1 is an example of the first module. In addition, in the example described above, the liquid discharge module 20-1 is an example of the second module. In addition, in the example described above, the first circuit substrate B1 of the head drive module 10-1 is an example of the first substrate. In addition, in the example described above, the aggregate substrate 33 of the liquid discharge module 20-1 is an example of the second substrate.

In addition, the cooling unit according to the embodiment is a cooling unit attached to a first head unit including a first drive circuit that generates a first drive signal and a first discharge section that discharges a liquid onto a medium based on the first drive signal, and a second head unit including a second drive circuit that generates a second drive signal and a second discharge section that discharges a liquid onto the medium based on the second drive signal, the cooling unit including: a blowing section generating an airflow; a first wind tunnel guiding the airflow to a first path; and a second wind tunnel guiding the airflow to a second path different from the first path, in which the first drive circuit is disposed inside the first wind tunnel, the second drive circuit is disposed inside the second wind tunnel, and the first discharge section and the second discharge section are disposed outside the first wind tunnel and the second wind tunnel.

With this configuration, the first discharge section and the second discharge section that can cause the ink mist and the first drive circuit and the second drive circuit in which a short circuit can occur due to the ink mist can be separated into separate spaces by the first wind tunnel and the second wind tunnel, thereby reducing a possibility of generating a short circuit in the first drive circuit and the second drive circuit. Further, since the first drive circuit and the second drive circuit are disposed in separate wind tunnels, even when the ink mist enters one wind tunnel, it is possible to reduce a possibility that a short circuit occurs in the drive circuit disposed in the other wind tunnel. In addition, since the cooling is performed by air cooling, even when the first drive circuit and the second drive circuit have electronic components protruding from the substrate, such as coils and capacitors, these electronic components can be efficiently cooled.

In the example described above, the cooling unit 6 is an example of the cooling unit. In addition, in the example described above, the drive circuit section DRV included in the head drive module 10-1 is an example of the first drive circuit. In addition, in the example described above, the drive signals COMA, COMB, and COMC output from the drive circuit section DRV of the head drive module 10-1 are examples of the first drive signal. In addition, in the example described above, the drive circuit section DRV included in the head drive module 10-2 is an example of the second drive circuit. In addition, in the example described above, the drive signals COMA, COMB, and COMC output from the drive circuit section DRV of the head drive module 10-2 are examples of the second drive signal. In addition, in the example described above, the discharge section 600 included in the liquid discharge module 20-1 is an example of the first discharge section. In addition, in the example described above, the discharge section 600 included in the liquid discharge module 20-2 is an example of the second discharge section. In addition, in the example described above, the intake fan FNi and the exhaust fan FNo are examples of the blowing section. In addition, in the example described above, the first wind tunnel WT1 is an example of the first wind tunnel. In addition, in the example described above, the second wind tunnel WT2 is an example of the second wind tunnel.

What is claimed is:

1. A liquid discharge apparatus comprising:
a first drive circuit generating a first drive signal;
a second drive circuit generating a second drive signal;
a first discharge section discharging a liquid onto a medium based on the first drive signal;
a second discharge section discharging a liquid onto the medium based on the second drive signal;
a blowing section generating an airflow;
a first wind tunnel guiding the airflow to a first path; and
a second wind tunnel guiding the airflow to a second path different from the first path, wherein
the first drive circuit is disposed inside the first wind tunnel,
the second drive circuit is disposed inside the second wind tunnel, and
the first discharge section and the second discharge section are disposed outside the first wind tunnel and the second wind tunnel.

2. The liquid discharge apparatus according to claim 1, further comprising:
an adjustment section adjusting a blowing amount to the first wind tunnel and a blowing amount to the second wind tunnel.

3. The liquid discharge apparatus according to claim 2, further comprising:
a control section controlling the adjustment section such that, when a heat generation amount of the first drive circuit is larger than a heat generation amount of the second drive circuit, the blowing amount to the first wind tunnel is larger than the blowing amount to the second wind tunnel.

4. The liquid discharge apparatus according to claim 1, further comprising:
a housing encompassing the first drive circuit, the second drive circuit, the first discharge section, and the second discharge section, wherein
the first wind tunnel and the second wind tunnel constitute a duct disposed inside the housing, and
the duct includes an intake port for sucking air from an outside of the housing.

5. The liquid discharge apparatus according to claim 4, wherein
the duct includes an exhaust port for discharging air to the outside of the housing.

6. The liquid discharge apparatus according to claim 5, wherein
the blowing section includes a first blowing section sucking air from the intake port and a second blowing section discharging air from the exhaust port, and
a blowing amount of the first blowing section is larger than a blowing amount of the second blowing section.

7. The liquid discharge apparatus according to claim 1, further comprising:
a heat exchange section performing heat exchange, wherein
the first wind tunnel and the second wind tunnel constitute a duct,
the duct is a closed circuit in which air circulates, and
the air in the duct is cooled by the heat exchange section.

8. The liquid discharge apparatus according to claim 1, wherein
the first drive circuit is included in a first module including a first substrate,
the first discharge section is included in a second module including a second substrate, and
the first substrate and the second substrate are B-to-B coupled.

9. A cooling unit attached to a first head unit including a first drive circuit that generates a first drive signal and a first discharge section that discharges a liquid onto a medium based on the first drive signal, and a second head unit including a second drive circuit that generates a second drive signal and a second discharge section that discharges a liquid onto the medium based on the second drive signal, the cooling unit comprising:
a blowing section generating an airflow;
a first wind tunnel guiding the airflow to a first path; and
a second wind tunnel guiding the airflow to a second path different from the first path, wherein
the first drive circuit is disposed inside the first wind tunnel,
the second drive circuit is disposed inside the second wind tunnel, and
the first discharge section and the second discharge section are disposed outside the first wind tunnel and the second wind tunnel.

* * * * *